United States Patent [19]
Une et al.

[11] Patent Number: 4,656,347
[45] Date of Patent: Apr. 7, 1987

[54] DIFFRACTION GRATING POSITION ADJUSTER USING A GRATING AND A REFLECTOR

[75] Inventors: Atsunobu Une; Makoto Iki; Nobuyuki Takeuchi; Kimiyoshi Deguchi, all of Kanagawa, Japan

[73] Assignee: Nippon Telegraph & Telephone Public Corporation, Tokyo, Japan

[21] Appl. No.: 695,698

[22] Filed: Jan. 28, 1985

[30] Foreign Application Priority Data

| Jan. 30, 1984 | [JP] | Japan | 59-14692 |
| Sep. 26, 1984 | [JP] | Japan | 59-199433 |
| Dec. 3, 1984 | [JP] | Japan | 59-254242 |
| Jan. 21, 1985 | [JP] | Japan | 06-8694 |

[51] Int. Cl.$^4$ .................. G01B 11/02; G01N 21/86
[52] U.S. Cl. ........................ 250/201; 250/548; 250/237G; 356/356
[58] Field of Search ........ 356/399, 400, 345, 354–358, 356/363, 372–375; 250/201, 548, 550, 216, 571, 578, 234, 237 R, 237 G

[56] References Cited

U.S. PATENT DOCUMENTS

| 4,188,124 | 2/1980 | Jaerisch et al. | 356/356 |
| 4,200,395 | 4/1980 | Smith et al. | 250/550 X |

FOREIGN PATENT DOCUMENTS

| 53-32759 | 3/1978 | Japan . | |
| 56-61608 | 5/1981 | Japan . | |
| 2023281 | 12/1979 | United Kingdom | 356/375 |

OTHER PUBLICATIONS

Austin, S. et al, "Alignment of X-Ray Lithography Masks Using A New Interferometric Technique-Experemental Results", *J. Vac. Sci. Technol.*, vol. 15, No. 3, May/Jun. '78, pp. 984–986.

"A Step-and-Repeat X-Ray Lithography System SR-1 1. System Design" by H. Kinoshita et al., Bull. Japan Soc. of Prec. Engg., pp. 195–196, vol. 16, No. 3 (Sep. 1982).

"A Step-and-Repeat X-Ray Lithography System SR-1 2. Alignment System" by E. Kawaguchi et al., Bull. Japan Soc. of Prec. Engg., pp. 197–198, vol. 16, No. 3 (Sep. 1982).

"A Step-and-Repeat X-Ray Lithography System SR-1 3. Positioning Mechanism System" by K. Deguchi et al., Bull. Japan Soc. of Prec. Engg., pp. 199–200, vol. 16, No. 3 (Sep. 1982).

"Step-and-Repeat Water Imaging" by S. Wittekoek, pp. 80–84, Jun. 1980, Solid State Technology.

"Experimental evaluation of interferometric alignment techniques for multiple mask registration" by T. M. Lyszczarz et al. pp. 1214–1218, *J. Vac. Sci. Technol.*, Nov./Dec. 1981.

*Primary Examiner*—Eugene R. LaRoche
*Assistant Examiner*—David Mis
*Attorney, Agent, or Firm*—Blakely, Sokoloff, Taylor & Zafman

[57] ABSTRACT

A method of adjusting a relative positional relationship between two objects uses a diffraction grating. A first diffraction grating is arranged on a first object located to oppose a second object, a reflecting surface is arranged at a position of the second object which corresponds to the first diffraction grating, and the method includes the step of irradiating the first diffraction grating with a radiation beam of coherent light or quasi-monochromatic light and measuring/setting the gap between the first and second objects in accordance with a change in intensity of one of the diffracted light components from the first diffraction grating.

25 Claims, 40 Drawing Figures

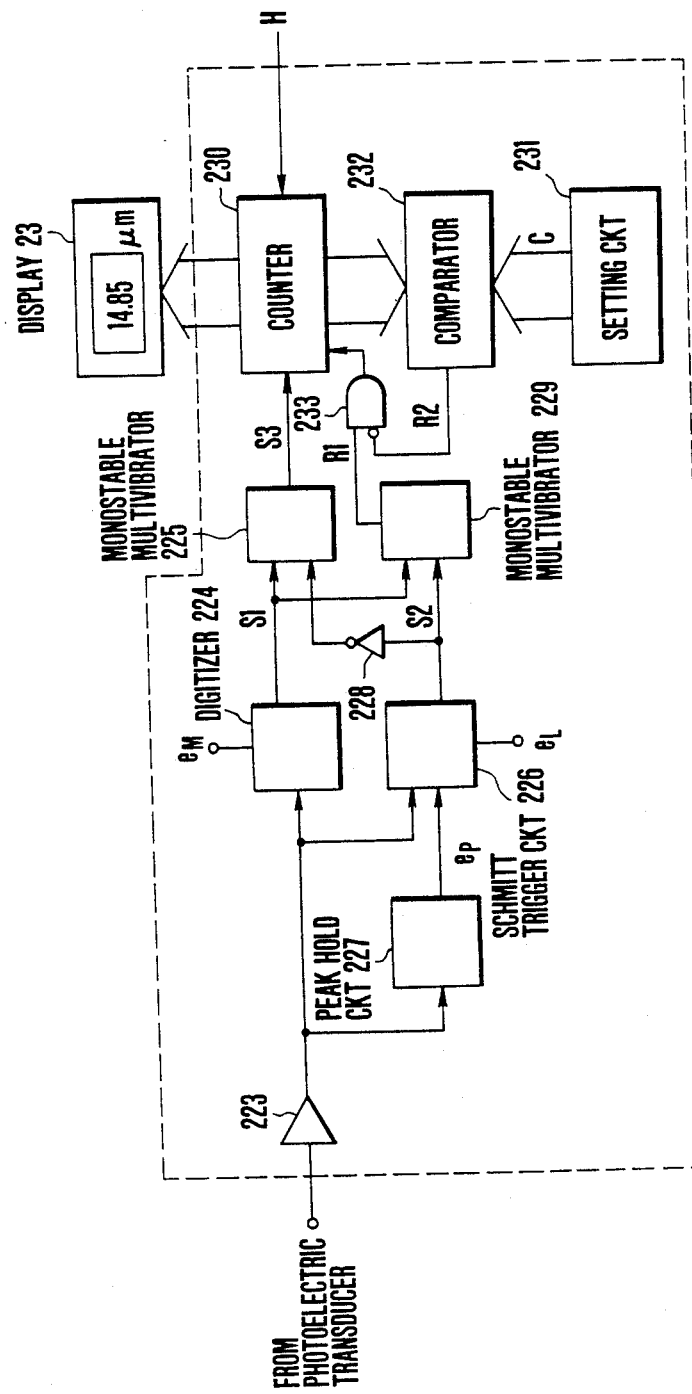

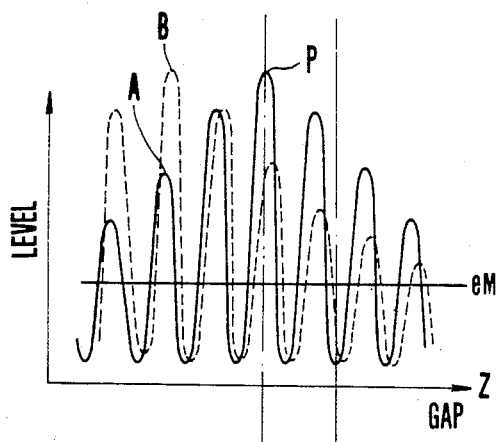
FIG.14A
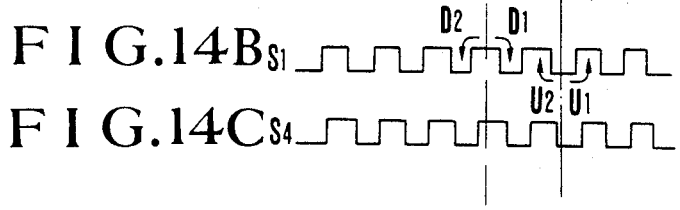
FIG.14B
FIG.14C
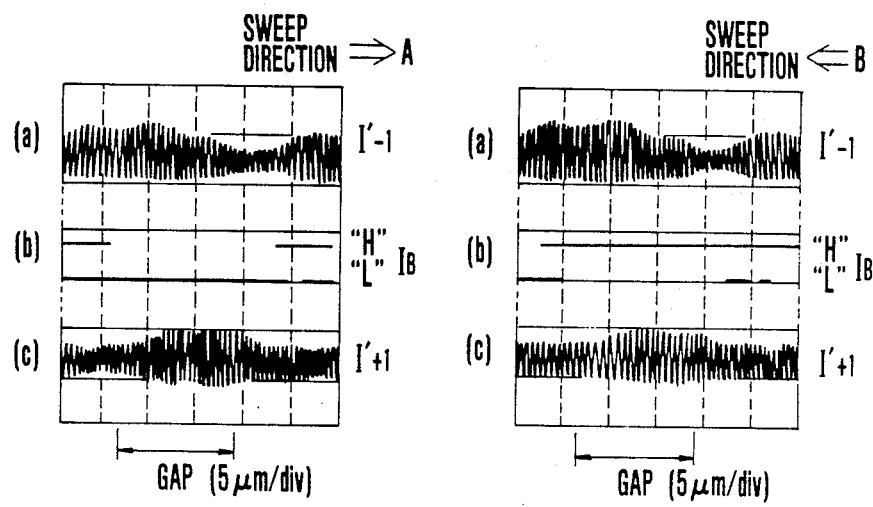
FIG.15  FIG.16

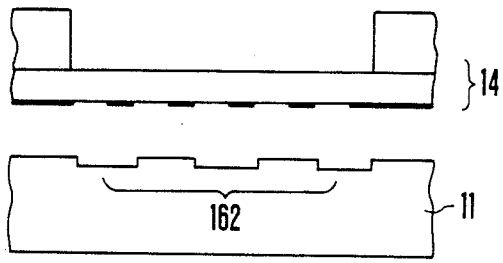
F I G. 24
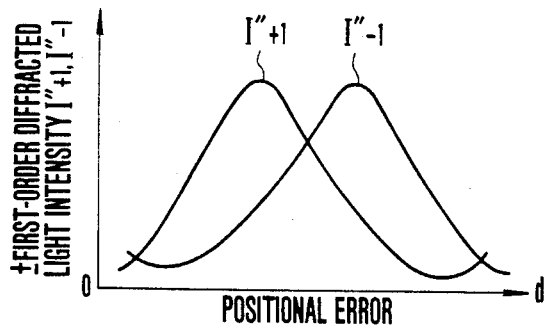
F I G. 25A
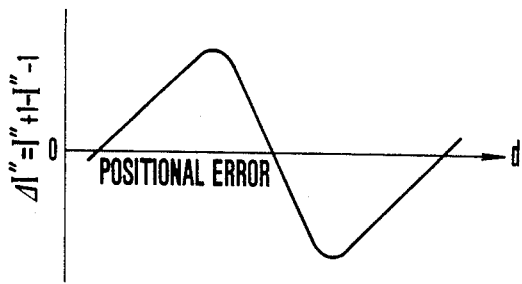
F I G. 25B
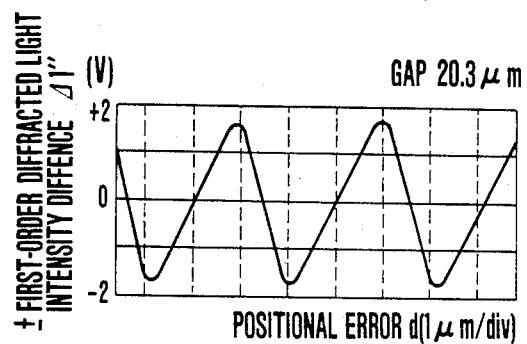
F I G. 26

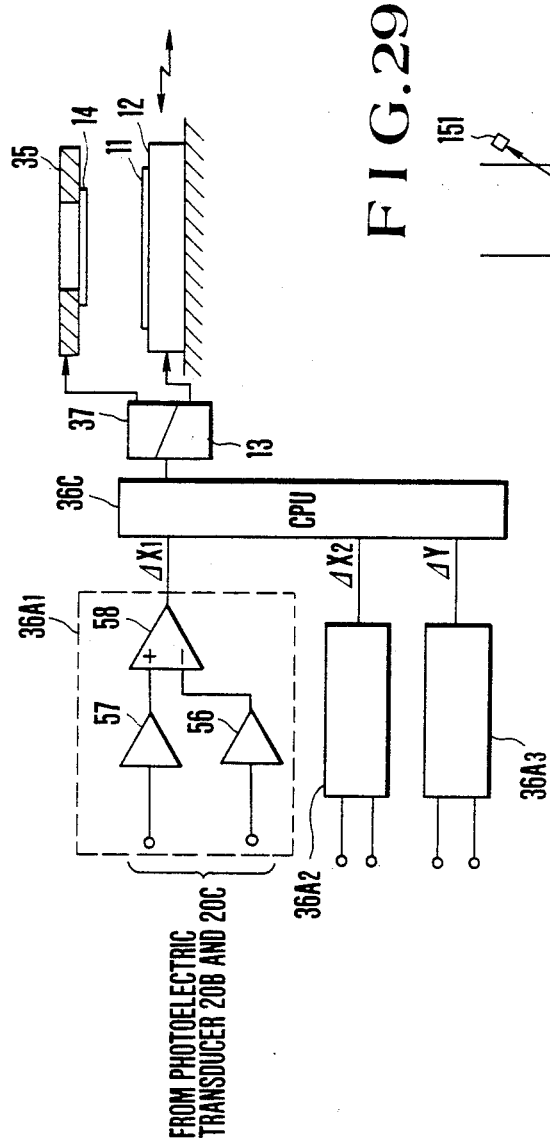
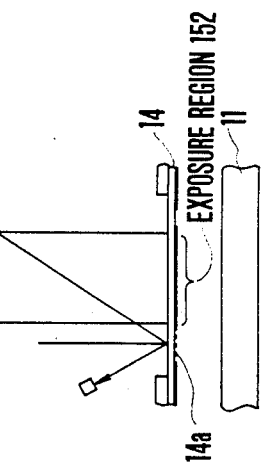
FIG.29
FIG.30

DIFFRACTION GRATING POSITION ADJUSTER USING A GRATING AND A REFLECTOR

BACKGROUND OF THE INVENTION

The present invention relates to a method of measuring and controlling a gap between two objects by using a diffraction grating, a method of aligning the two objects relative to each other by utilizing the method of measuring and controlling the gap, and an apparatus for implementing these methods, these methods and apparatus being applied to an exposure apparatus for manufacturing semiconductor ICs and LSIs, a pattern evaluation apparatus, a microgap measuring apparatus, or a high precision aligner.

An X-ray exposure apparatus has been developed as an apparatus for producing submicron patterns in a mass production line and for micropatterning of semiconductor ICs and LSIs. In a conventional X-ray exposure apparatus using a divergent X-ray source, high-precision alignment (to be referred to as an alignment or transverse alignment hereinafter) of a predetermined position of a mask with a corresponding position of a wafer must be inevitably performed in a two-dimensional manner. At the same time, another alignment must be performed wherein a distance, i.e., a gap between the mask and the wafer is set at a predetermined value with high precision.

A conventional transverse alignment method is described as a dual diffraction grating method in J. Vac. Sci. Technol. Vol. 19, No. 4, NOV/DEC 1981, pp. 1214–1218. According to such a dual diffraction grating method, a laser beam from a laser source is incident on a positional error detection mask mark formed on the mask, reflected by a positional error detecting wafer mark formed on the wafer, and then again passes through the positional error detection mask mark. The mask and wafer marks comprise diffraction gratings, respectively. More specifically, the wafer mark comprises a transmission diffraction grating, while the wafer mark comprises a reflection diffraction grating.

Among the light components diffracted by the positional error detecting mask and wafer marks, positive and negative first-order diffracted light components which are diffracted symmetrically about the incident light are incident on photoelectric transducers, respectively. The photoelectric transducers convert the reflected light intensity components $I+1$ and $I-1$ to electrical signals. A difference $\Delta I(=I+1-I-1)$ between these signals is calculated, and transverse alignment can be performed in accordance with the difference $\Delta I$. The difference $\Delta I$ comprises a repeating waveform in synchronism with a pitch P0 of the diffraction grating. When the two diffraction gratings completely match with each other (i.e., a relative positional error $d=0$) or the relative positional error d therebetween is P0/2, the difference $\Delta I$ is zero irrespective of the gap between the mask and the wafer. Therefore, the stage is moved to perform an alignment such that the difference $\Delta I$ is set to zero.

A gap is set such that the gap is measured by a capacitive gap sensor arranged around the mask. However, a curve representing changes in the difference $\Delta I$ with respect to the relative positional error d greatly changes even if the gap Z is slightly changed. For example, according to the above-mentioned reference, when a change in the difference $\Delta I$ with respect to the relative positional error d at a laser beam wavelength $\lambda=0.6328$ μm and the pitch P0=1.1 μm is obtained, a curve for $Z=20.02$ μm becomes a smoothly period curve, however it for $Z=20.05$ μm includes many upper and lower peaks and many zero-crossing points. For this reason, alignment control requires a long time, thus hindering high precision alignment. Theoretically, high precision alignment is performed by using a $\Delta I$ curve for $Z=20.02$ μm. For this purpose, the gap must be highly accurate, and variations must be minimized. However, no conventional apparatus satisfies such a need. Demand has thus arisen for a gap measuring/control method of precisely measuring and controlling the gap and a gap measuring/control apparatus for implementing such a method.

Since the above-mentioned gap sensor has a large size, it is difficult to measure the gap in the vicinity of the diffraction gratings for measuring the positional error. When the wafer or the mask has poor flatness, gap measurement is performed in the vicinity of the peripheral portion of the mask. Even if the gap immediately under the gap sensor is accurately measured by the above-mentioned gap sensor, the gap between the positional error detecting mask and wafer marks cannot be always set at an optimal value, resulting in inconvenience. Therefore, it is difficult to perform high precision alignment control in accordance with the dual diffraction grating method. Therefore, demand has thus arisen for a gap measuring/control method for measuring and controlling with high precision the gap in the vicinity of the positional error detecting marks and a gap measuring/control apparatus for implementing such a method.

SUMMARY OF THE INVENTION

It is, therefore, a principal object of the present invention to provide a method of measuring/controlling easily and with high precision a gap between two objects by using a diffraction grating, and an apparatus therefor.

It is another object of the present invention to provide a method of measuring/controlling a gap between two objects by using a diffraction grating so as to improve a detection resolution as compared with the conventional case, and an apparatus therefor.

It is still another object of the present invention to provide a gap control method of automatically correcting a gap error by detecting an error state when the gap between the two objects deviates from the preset value, and an apparatus therefor.

It is still another object of the present invention to provide a method of adjusting a relative positional relationship between two objects whereby gap control point and alignment point of these two objects can be arranged at positions on the same plane close to each other, and an apparatus therefor.

It is still another object of the present invention to provide a method of adjusting a relative positional relationship between two objects by using a diffraction grating, and an apparatus therefor wherein transverse alignment of the two objects is performed while a gap therebetween is controlled, thereby greatly shortening the aligning time.

In order to achieve the above objects of the present invention, a diffraction grating is arranged with respect to a first object, and a reflecting surface is formed on a portion of a second object which corresponds to the diffraction grating, the second object being spaced by a predetermined gap from the first object. A light source is arranged above the first object to emit coherent light or quasi-monochromatic light. The light emitted from the light source is diffracted reflectively by the diffraction grating to constitute a diffracted light component. On the other hand, the light passes through the diffraction grating and is reflected by the reflecting surface, and is diffracted again by the diffraction grating to constitute another diffracted light component. A gap between the objects is measured by the composite diffracted light intensity composed of these components. The gap measurement is utilized for gap control and transverse alignment.

According to an aspect of the present invention, therefore, there is provided a method of adjusting a relative positional relationship between two objects using a diffraction grating, wherein a first diffraction grating is arranged on a first object located to oppose a second object, a reflecting surface is formed at a position of the second object which corresponds to the first diffraction grating, and the method includes the step of irradiating the first diffraction grating with a radiation beam of coherent light or quasi-monochromatic light and measuring/setting a gap between the first and second objects in accordance with a change in intensity of diffracted light components from the first diffraction grating.

According to another aspect of the present invention, there is provided an apparatus for adjusting a relative positional relationship between two objects using a diffraction grating, comprising: at least a first diffraction grating formed on a portion of a first object which corresponds to a reflecting surface of a second object; first irradiating means for irradiating a first radiation beam of coherent light or quasi-monochromatic light; first converting means for receiving a first diffracted light component from the first diffraction grating and converting the first diffracted light component to a gap detection signal; and processing means for processing the gap detection signal to calculate a gap between the first and second objects.

BRIEF DESCRIPTION OF THE DRAWINGS

FIG. 4 is a block diagram of a processing circuit of a gap detection signal shown in FIG. 1;

FIGS. 14A, 14B and 14C are respectively timing charts for explaining the discrimination of the gap error state;

FIGS. 15 and 16 are respectively graphs showing the test results of the phase error;

FIG. 24 is a sectional view showing the arrangement of a positional error detection double pitch diffraction grating mark;

FIGS. 25A and 25B are respectively timing charts for explaining the operation of detecting the positional error;

FIG. 26 is a graph showing the plus and minus first-order diffracted light intensity difference ΔI as a function of the positional error when the gap is 20.3 $\mu$m;

FIG. 29 is a diagram showing a processing/control circuit for generating the positional error detection signal in the apparatus of FIG. 27;

FIG. 30 is a diagram showing the arrangement of a detector for receiving the diffracted light;

DESCRIPTION OF THE PREFERRED EMBODIMENTS

Figure 1:
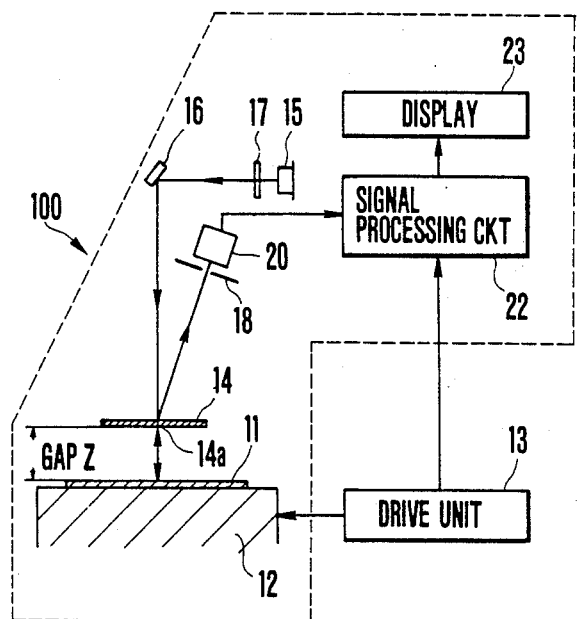
FIG. 1 is a diagram showing the basic arrangement of a gap measuring apparatus according to an embodiment of the present invention.

FIG. 1 shows an embodiment of the present invention which is applied to a gap measuring apparatus for measuring a gap between a semiconductor wafer and a mask. A gap measuring apparatus 100 has a table 12 which supports a wafer 11 thereon. The table 12 is vertically (or horizontally) driven by a drive unit 13. A mask 14 having a gap detection diffraction grating mark 14a is arranged to be spaced by a predetermined gap from the semiconductor wafer 11. The mask 14 has a predetermined pattern to form predetermined semiconductor devices on the wafer 11.

A light source such as a laser light source 15 is arranged above the mask 14 so as to emit coherent light or quasi-monochromatic light. A reflection mirror 16 is arranged to form an optical path for guiding a laser beam from the light source 15 to the mask 14. A λ/4 plate 17 is arranged between the reflection mirror 16 and the laser source 15 to reduce backtalk. A photoelectric transducer 20 is arranged above the mask 14 and is deviated from the above optical path of the laser beam. The photoelectric transducer 20 receives light diffracted reflectively by the mark 14a, and reflected by the surface (reflection surface) of the the wafer and diffracted by the mark 14a through a spatial filter 18. The apparatus 100 further comprises a signal processing circuit 22 and a display 23. The signal processing circuit 22 receives an electrical signal from the photoelectric transducer 20 and calculates a gap Z between the mask 14 and the wafer 11. The display 23 displays the calculated absolute gap Z between the wafer 11 and the mask 14.

A method of measuring a gap between two objects (the mask 14 and the wafer 11 in this embodiment) using the apparatus shown in FIG. 1 will be described hereinafter, where a measurement of a gap is obtained by utilizing a diffracted light component obtained when the laser beam is either vertically or obliquely incident on the mask 14. In the following description, a first-order light component obtained when the laser beam is vertically incident is utilized.

Figure 2:
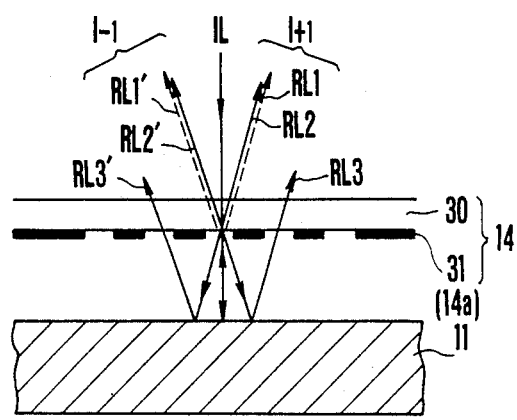
FIG. 2 is an enlarged view showing the main part of the apparatus of FIG. 1 so as to explain gap detection diffracted light.

With the arrangement shown in FIG. 1, the laser beam horizontally is emitted from the laser source 15 and is linearly polarized by the λ/4 plate 17. The laser beam is then reflected by the reflection mirror 16, and the reflected laser beam is incident on the mask 14 at a right angle. More specifically, the reflected laser beam is incident on the gap detection diffraction grating mark 14a formed on the mask 14. The incident laser beam is diffracted by the mark 14a, thereby generating various diffracted light components, as shown in FIG. 2.

The mark 14a comprises a diffraction grating. This diffraction grating is prepared such that a thin opaque film 31 made of Cr or Al is formed on one major surface (the lower surface in this embodiment) of a transparent substrate 30 made of glass serving as the base of the mask 14, or a thin opaque film 31 made of Au or Ta is formed on one major surface of a thin transparent silicon nitride film 30 formed on the silicon wafer. A coherent beam IL incident on the mask 14 is diffracted reflectively by the lower surface of the mask 14 to obtain diffracted beams RL1 and RL1' (illustrated by the dotted lines) which are symmetrical about the optical axis of the incident beam IL at a given angle. The beam transmitted and diffracted by the mark 14a is reflected by the reflecting surface of the wafer 11 and is passing through the mark 14a to produce transmitted and diffracted beams RL3 and RL3' (illustrated by the solid lines). The beam passing through the mark 14a is reflected by the reflecting surface of the wafer 11 and is transmitted and diffracted by the mark 14a to produce transmitted and diffracted beams RL2 and RL2' (illustrated by the solid lines). In addition, other reflected and diffracted (not shown) or transmitted and diffracted beams (not shown) are also produced. Among the resultant beams, first-order diffracted beams I+1 (or I−1) consisting of the beams RL1, RL2 and RL3 (or the beams RL1', RL2' and RL3') are incident on the photoelectric transducer 20 through the spatial filter 18. An output from the photoelectric transducer 20 is supplied to the signal processing circuit 22 to detect a gap Z. The display 23 displays this gap Z.

Figure 3:
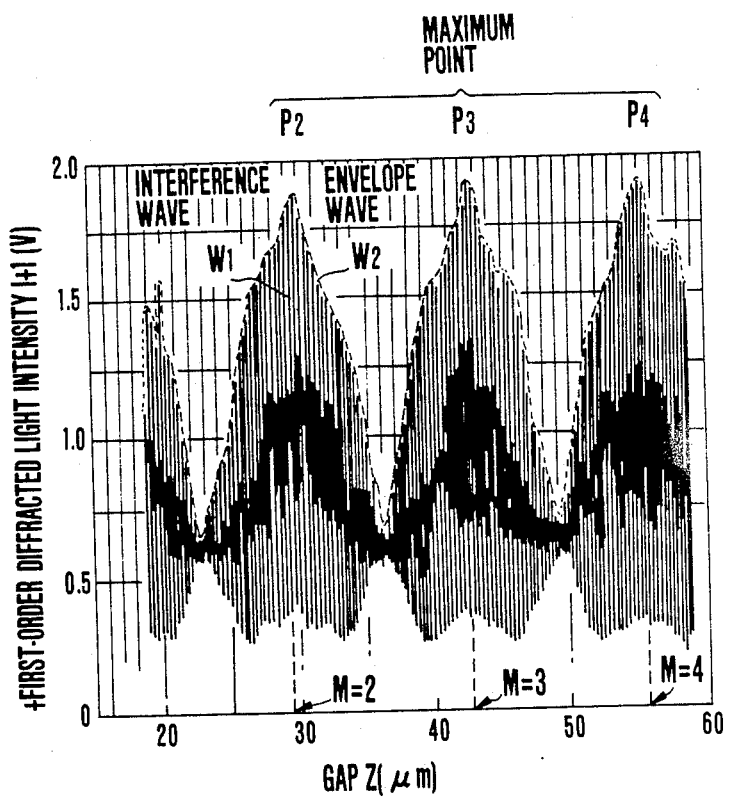
FIG. 3 is a graph showing the first-order diffracted light intensity as a function of the gap.

FIG. 3 shows test results obtained when the first-order diffracted light I+1 is used to obtain a gap detection signal when an He-Ne laser beam has a wavelength of 0.6328 μm and a diffraction grating mark has a pitch P of 3 μm. The I+1 gap detection signal is obtained as a superposed wave of a λ/2-period interference wave W1 as a result of interference between the beam RL1 and the beams RL2 and RL3 and a $P^2/\lambda$-period envelope wave W2 which represents the envelope wave of the interference wave W1. Peaks or maximum points P1, P2 and P3 of the envelope wave W2 appear at the gap Z which satisfies condition $M=\lambda Z/P^2 = k$ (k is an integer) The diffraction grating mark 14a is prealigned near the wafer 11 (i.e., not more than the gap value which satisfies condition M=1, in this case, 14.2 μm) and is gradually moved away therefrom. When the signal processing circuit 22 detects the first maximum point P1 (i.e., M=1), the corresponding gap becomes the absolute gap. In this embodiment, the gap is 14.2 μm. In other words, the gap can be absolutely measured. When the first maximum point is detected, a counter in the signal processing circuit 22 is set at 14.2 μm. The number of interference wave peaks from the first maximum value is counted by the signal processing circuit which performs predetermined processing, thereby measuring the absolute gap. The measurement of the absolute gap will be described in more detail with reference to a description of the signal processing circuit 22.

Figure 5A:
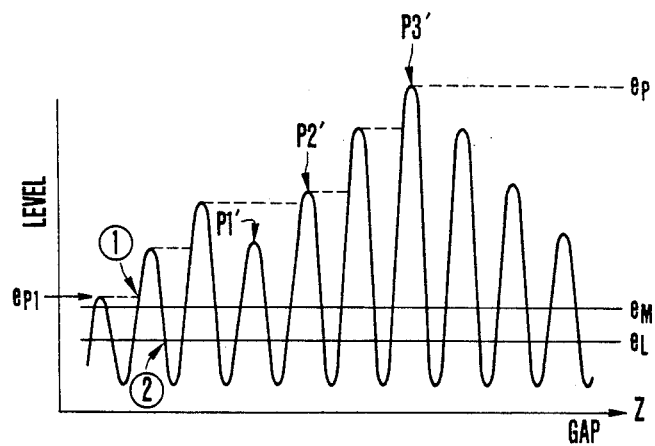
FIGS. 5A to 5F are respectively timing charts for explaining the operation of FIG. 4.
Figure 5B:
Figure 5C:
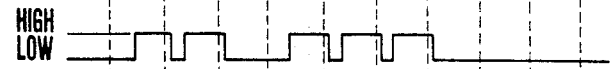
Figure 5D:
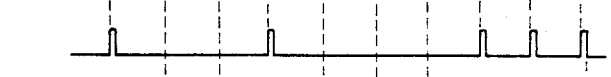
Figure 5E:

FIG. 4 shows a detailed arrangement of the signal processing circuit 22 and the display 23 of FIG. 1. Referring to FIG. 4, an electrical signal from the photoelectric transducer 20 is supplied to an amplifier 223 and is amplified thereby. An amplified output (i.e., a gap detection signal) from the amplifier 223 is supplied to a digitizer 224. The gap detection signal is converted to a binary signal S1 (FIG. 5B) by the digitizer 224 in accordance with a threshold value eM (FIG. 5A). The binary signal S1 is supplied to a monostable multivibrator 225. The gap detection signal as the output from the amplifier 223 is also supplied to a peak hold circuit 227 which then holds the peak value ep (FIG. 5A) of each interference wave. The gap detection signal is then supplied to a Schmitt trigger circuit 226 which combines the gap detection signal with the peak value ep from the peak hold circuit 227 and a threshold value eL. The Schmitt trigger circuit 226 generates a binary signal S2 shown in FIG. 5C. The above operation will be briefly described in detail with reference to FIG. 5A. When the gap detection signal exceeds the first peak hold value ep1 (i.e., ①), the binary signal S2 goes high, as shown in FIG. 5C. However, when the gap detection signal is smaller than the threshold value eL (i.e., ②), the binary signal S2 goes low. Therefore, even if an interference wave having a peak value smaller than the peak hold value of the previous input interference waves such as the wave P1 shown in FIG. 5A is input, the output S2 from the Schmitt trigger circuit 226 will not go high. The binary signal S2 is supplied to the monostable multivibrator 225 through an inverter 228 in the same manner as the binary signal S1. When the binary signal S2 is set at low level, that is, when the output from the inverter 228 is set at high level, the monostable multivibrator 225 generates a pulse S3 (FIG. 5D) at the trailing edge of the signal S1. When the signal S2 is set at high level, a monostable multivibrator 229 generates a pulse R1 (FIG. 5E) at the trailing edge of the signal S1. The pulse S3 from the monostable multivibrator 22 is supplied to a pulse counter 230 and is counted. The pulse counter 230 is reset to zero (an operation which will be described later) in response to the output pulse R1 from the monostable multivibrator 229.

Figure 5F:
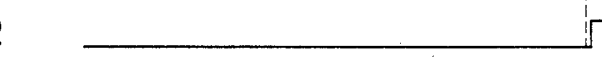

A count of the counter 230 is set to 1 in response to the pulse S3 generated by the interference wave P1' shown in FIG. 5A. However, the pulse S2 goes high in response to the next interference wave P2', so that the count of the counter 230 is reset to zero in response to the pulse R1. It should be noted here that one input terminal of a gate circuit 233 in which the other input terminal receives the pulse R1 is set at low level. When an interference wave having peak values larger than the maximum peak of the interference wave P3' is not detected upto a predetermined count number C after the interference wave P3' is detected, it is assumed that the maximum peak interference wave P3' is defined as a maximum value of the envelope wave. Under this assumption, the count K from the pulse counter 230 for counting the pulse S3 is compared by a comparator 232 with the predetermined count number C (C=3 in FIG. 5A) from a setting circuit 231. When the count K representing the number of pulses S3 after the maximum peak interference wave P3' is detected coincides with the predetermined count number C, the signal R2 goes high, as shown in FIG. 5F. The signal R2 of high level disables the gate circuit 233. Thereafter, even if the pulse R1 is generated, the count of the pulse counter 230 will not be reset. In other words, the count is incremented in response to the pulse S3, i.e., the binary signal S1. It should be noted that the signal R2 is set at low level when the system is initialized.

Instead of being increased, the envelope wave of the gap detection signal may be temporarily decreased until the interference wave P3' having the maximum peak is detected. The predetermined count number C is prepared so as to not erroneously detect this point as the maximum value. The count of the pulse counter 230 is decremented when a moving direction signal H representing a moving direction of the table 12 of FIG. 1 is set low level (representing the upward movement of the table 12). However, the count is incremented when the moving direction signal H is set at high level (representing the downward movement of the table 12).

By using the count K obtained in the manner described above, the pulse counter 230 calculates the absolute gap Z in accordance with equation (1), and the calculated absolute gap Z is displayed on the display 23.

$$Z = P^2/\lambda + K \cdot \lambda/2 \qquad (1)$$

In order to change the preset value of the gap, the pitch P or the wavelength $\lambda$ of the laser beam is changed. After the gap Z is measured and the actual gap is adjusted to the measured gap Z, a reference voltage Eg lower than the maximum peak of the interference wave P3 is set and a gap servo operation of not more than +0.01 $\mu$m can be performed. This operation will be described later with reference to FIGS. 17 and 18.

In the above description, the positive first-order diffracted light derived such that the laser beam is incident on the mask 14 at a right angle is utilized to measure the gap between the mask and the wafer. A case will be briefly described hereinafter wherein other diffracted light components are used.

Figure 6:
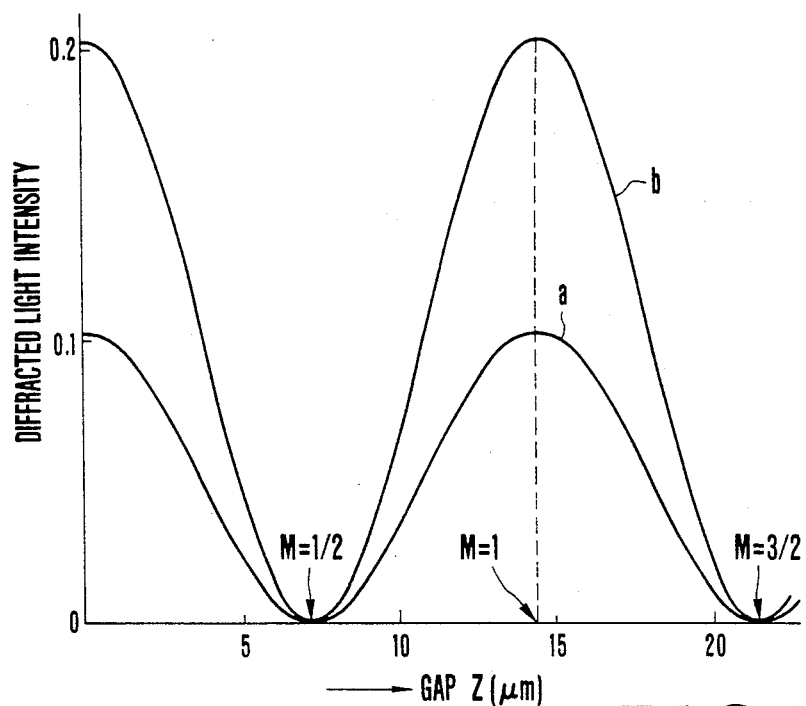
FIG. 6 is a graph showing the diffracted light intensity as a function of the gap when the laser beam is incident on the diffraction grating at a right angle.

The intensity of the negative first-order diffracted light $I-1$ upon vertical incidence of the laser beam on the mask 14 and a sum signal $\Sigma I = I+1 + I-1$ periodically change with respect to the gap Z between the mask and the wafer, as is schematically illustrated in FIG. 6, in the same manner as the light $I+1$. The light $I-1$ and the sum signal $\Sigma I$ is minimum at a gap Z which satisfies condition $M = \lambda Z/P^2 = \frac{1}{2} + k$ (k is an integer) and is maximum at a gap Z which satisfies condition $M = \lambda Z/P^2 = k$. In this case, the wavelength $\lambda$ of the laser beam is 0.6328 $\mu$m, and the pitch P of the diffraction grating is 3 $\mu$m. Referring to FIG. 6, a curve a represents $I-1$, and a curve b represents I.

When the gap between the mask and the wafer is prealigned within a range corresponding to one period of 14.2 $\mu$m, the table 12 is moved to minimize or maximize the diffracted light intensity, thereby adjusting the gap so as to satisfy conditions $M = k + \frac{1}{2}$ or $M = k$. In the above description, the laser beam is incident on the mask at a right angle. However, the gap may also be measured if the laser beam is obliquely incident on the mask in a manner to be described below. When an incident angle $\theta$ of the laser beam with respect to the mask is given to satisfy condition $m = 2P \sin\theta/\lambda = 1$, the $\pm$ first-order diffracted light intensity sum $\Sigma I$ and intensity $I-1$ are minimum or maximum at gap points satisfying conditions $M = k/2 + \frac{1}{4}$ and $M = k/2$ (i.e., points corresponding to half of the period at which the laser beam is incident at a right angle). By moving the table 12 so as to detect the above points, the gap measurement or setting can be easily performed.

Figure 7:
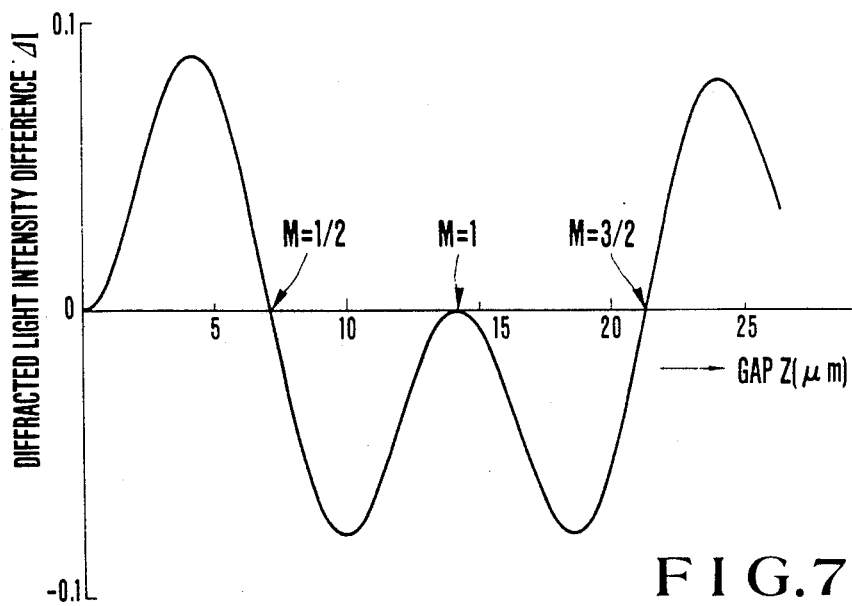
FIG. 7 is a graph showing the diffracted light intensity difference as a function of the gap when the laser beam is obliquely incident on the diffraction grating.

When the laser beam is obliquely incident at an inclined angle $\theta$ satisfying $m = 2P \sin\theta/\lambda = \frac{1}{2}$, a difference signal $\Delta I = I+1 - I-1$ between the positive and negative first-order diffracted light intensities causes zero-crossing at a gap Z which satisfies condition $M = k + \frac{1}{2}$, as shown in FIG. 7. The difference signal is zero at a gap Z satisfying $M = k$. When the table 12 is moved to decrease the gap to set the difference signal $\Delta I$ to zero and is stopped at a point corresponding to $\Delta I = 0$, gap measurement or setting can be easily performed.

FIGS. 6 and 7 are graphs showing the case where reflected and diffracted beams from the lower surface of the diffraction grating mark on the mask are not produced.

When reflected and diffracted beams are produced, these graphs represent envelope waves shown with dash line in FIG. 3. Gap measurement or setting can be performed by using the above circuit in the same manner mentioned above.

Figure 8:
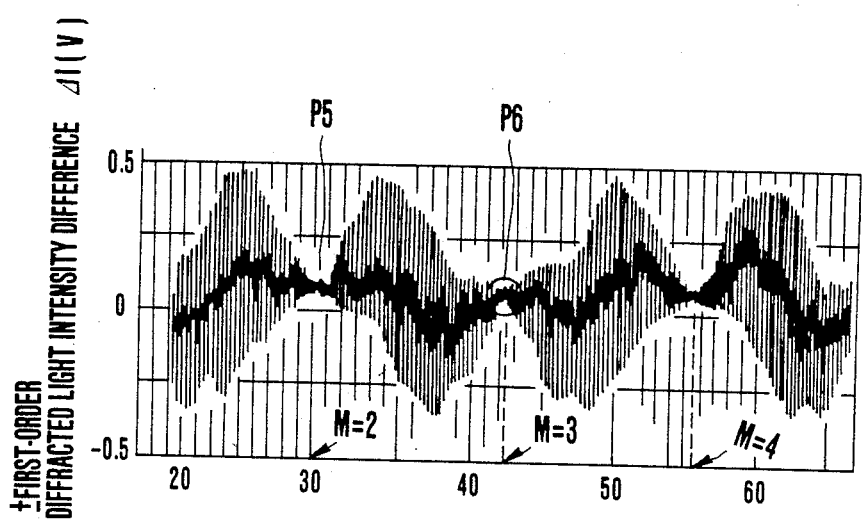
FIG. 8 is a graph showing the first-order diffracted light intensity as a function of the gap when the laser beam is obliquely incident on the diffraction grating while a light component reflected by the lower surface of the mask is present.
Figure 9:
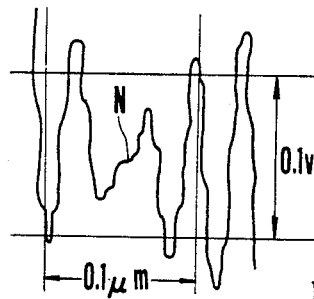
FIG. 9 is a graph showing an enlarged portion in the vicinity of the gap setting point.

FIG. 8 shows a test result of the difference signal $\Delta I$ between the positive and negative first-order diffracted light intensities with respect to the gap when the laser beam is obliquely incident on the laser diffraction grating mark at an inclined angle $\theta \approx 3°$ which satisfies condition $m = 2P\sin\theta/\lambda = \frac{1}{2}$. The laser and the diffraction grating are the same as those (when the laser beam is incident on the mask at a right angle) of FIG. 3. The envelope wave is minimum at a gap Z satisfying condition $M = k$. By moving the table 12 so as to detect these points P5 and P6, the gap measurement or setting can be easily performed. FIG. 9 is a graph showing an enlarged region of a circled portion of FIG. 8. Gap measurement or setting can be easily performed by detecting a middle point N of the interference wave which is a minimum amplitude.

Figure 10:
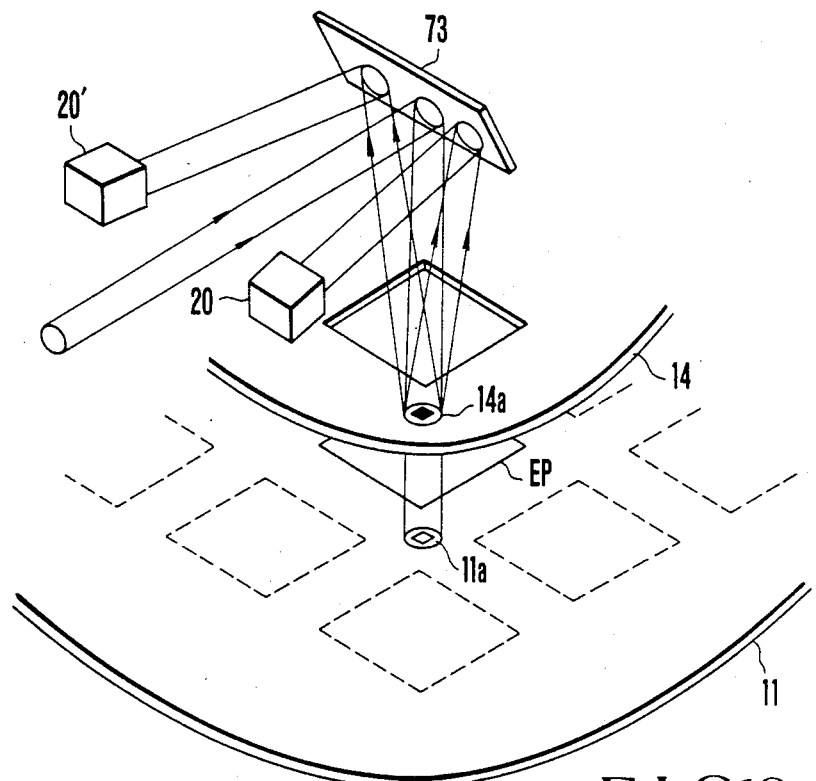
FIG. 10 is a perspective view showing a modification of the apparatus shown in FIG. 1.

The gap can be set in with high precision in accordance with a change in diffracted light intensity signals obtained when the laser beam is incident obliquely or at a right angle on the diffraction grating of the first object and the reflecting surface of the second object. In a manner to be described later, the interference wave is utilized to perform precise gap servo control with an error of not more than ±0.01 μm. A bifocal microscope measuring the relative gap between two objects or the like must be arranged in the vicinity of the mask mark 14a. However, the optical apparatus in the present invention need not be arranged. For example, as shown in FIG. 10, by arranging only a laser reflecting mirror 73, the beam for the gap setting can be incident and the diffracted light component can be properly detected without interfering the incidence of the beam for performing patterning, so a reflection wafer mark 11a can be arranged in the vicinity of the exposure pattern Ep. Therefore, even if the mask or wafer has a poor flatness, a gap therebetween can be accurately set. In addition to this advantage, wafer exposure can be extended to the peripheral portion thereof. Furthermore, the diffraction grating mark is formed only on a mask. Gap detection can be performed when a reflecting surface exists on the wafer. Therefore, the load to the marking process does not increase.

A method of automatically correcting a gap error in accordance with gap increase/decrease discrimination in the gap measuring apparatus, that is, correction performed with a gap error state signal representing an error from the preset value, and a gap control apparatus therefor will be described with reference to FIG. 11. A gap detection signal for measuring a gap and a reference signal for correcting a gap error are used in this gap control. As has been described with reference to the gap measuring/setting method, the gap detection signal is based on various diffracted light components. However, in the following description, the gap detection signal is obtained by using the positive first-order diffracted light derived from the laser beam incident on the mask at a right angle.

Figure 11:
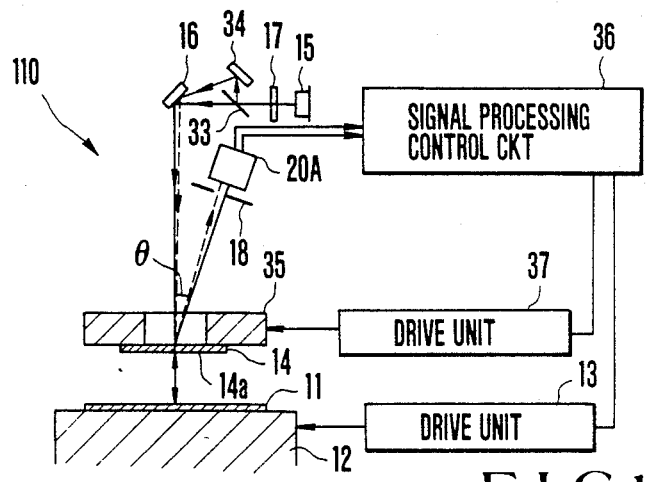
FIG. 11 is a diagram showing the basic arrangement of a gap control apparatus according to another embodiment of the present invention.

The following elements are added to the gap measuring apparatus of FIG. 1 to constitute a control apparatus 110 shown in FIG. 11. Referring to FIG. 11, a coherent beam is emitted from a laser source 15, passes through a λ/4 plate 17, and is split by a beam splitter 33 into two beams. One of the beams is guided directly to a reflecting mirror 16 in the same manner mentioned above. The other beam is guided to the reflecting mirror 16 through a reflecting mirror 34. The beams guided to the reflecting mirror 16 are incident on the mask 14 mounted on the lower surface of a mask stage 35. It should be noted that one beam is incident on the mask 14 at a right angle, and the other beam is obliquely incident thereon. The diffracted beams from a mark 14a of the mask 14 are received by a photoelectric transducer 20A through a spatial filter 18 in the same manner as in FIG. 1, except that the photoelectric transducer 20A comprises a two-split detector for splitting and receiving two incident beams.

The operation of the control apparatus shown in FIG. 11 will be described hereinafter.

The laser beam emitted from the laser source 15 is split by the beam splitter 33 into two beams. The beam are guided by the reflecting mirrors 34 and 16 and are obliquely incident on the mask 14 having the gap detection diffraction grating mark 14a at an angle of one to a few degrees (when the diffraction grating pitch is 3 μm), as indicated by the dotted line. Among the beams which are diffracted by the diffraction grating and are symmetrical about the optical axis of the incident beam, only the negative first-order diffracted light is supplied to the photoelectric transducer 20A through the spatial filter 18. The photoelectric transducer 20A converts the light component to an electrical signal. The electrical signal produced from the negative first-order diffracted light derived from the obliquely incident laser beam is supplied together with a gap detection signal produced from the positive first-order diffracted light derived from the vertically incident laser beam to a signal processing/control circuit 36. The electrical signal from the photoelectric transducer 20A serves as a reference signal. The gap error state is detected in accordance with a phase error between the gap detection signal and the reference signal. A gap is set at a predetermined value by using the gap detection signal based upon the vertically incident beam in accordance with the gap measuring method as previously described. When the actual gap is deviated from the preset gap, the signal processing/control circuit 36 calculates the gap error state and the gap error value by using the reference signal based upon the obliquely incident beam. The calculated values are fed as a feedback signal to a drive unit 37 for the mask stage 35 or a drive unit 13 for the table 12.

Gap error state discrimination and an automatic correction control method utilizing this discrimination will be described hereinafter.

Phases $\epsilon+1$ and $\epsilon-1$ of the positive first-order diffracted light based upon the vertically incident beam and the negative first-order diffracted light based upon the obliquely incident beam with respect to the gap, and envelope waves of the light components $I+1$ and $I'-1$ are calculated in accordance with the following equations, which have been simplified in accordance with theoretical relations introduced in Lectures, 43th Meeting, Association of Applied Physics, p. 27, 1982:

$$\epsilon+1 = -\pi M(1-\overline{m}) \quad (2)$$

$$\epsilon-1 = -\pi M(1+m) \quad (3)$$

$$I+1 = \cos^2\{\pi M(1-m)\} \quad (4)$$

$$I'-1 = \cos^2\{\pi M(1+m)\} \quad (5)$$

where $m=2P\sin\alpha/\lambda$ and $\alpha$ is the incident angle of the laser beam.

Figure 12:
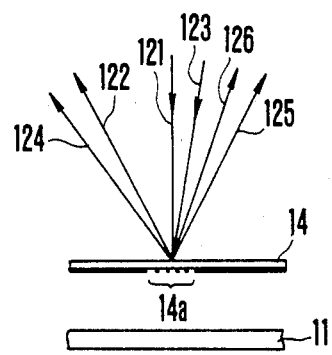
FIG. 12 is a diagram for explaining a gap control method according to the present invention.

FIG. 12 is a schematic diagram showing the incident and diffracted components of FIG. 11 in an enlarged manner. The intensity signal $I+1$ of the positive first-order diffracted light 125 derived from a first laser beam 121 incident on the mask at a right angle is used as a gap detection signal, and the intensity signal $I'-1$ of the negative first-order diffracted light 126 derived from a second laser beam 123 incident obliquely on the mask is used as a reference signal. Reference numeral 122 in FIG. 12 denotes negative first-order diffracted light derived from the laser beam 121; 124, positive first-order diffracted light derived from the laser beam 123.

Figure 13:
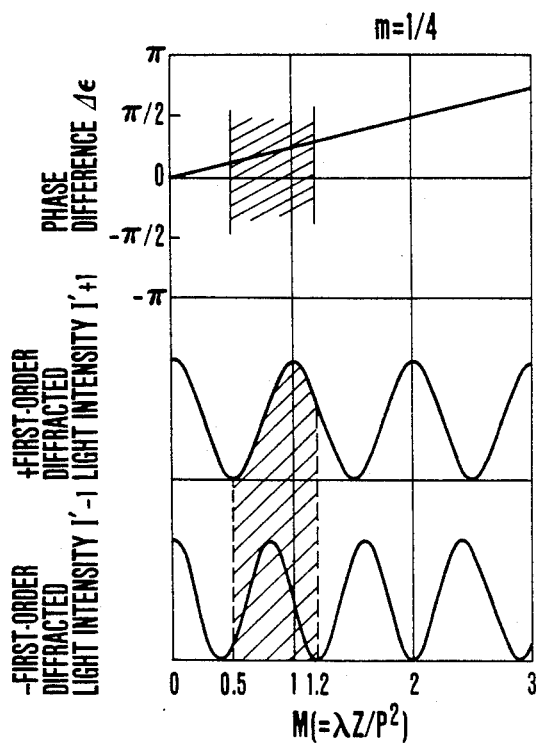
FIG. 13 is a graph showing the phase error between two diffracted light components and diffracted light intensities as a function of the gap so as to explaining the error state.

FIG. 13 is a graph showing a calculated phase error $\Delta\epsilon=\epsilon+1-\epsilon-1$ between the positive first-order diffracted light upon vertical incidence of the laser beam and the negative first-order diffracted light upon oblique incidence of the laser beam, and envelope waves of the intensity signals $I+1$ and $I'-1$ in accordance with equations (2) to (5) for $m=\frac{1}{2}$, $\lambda=0.6328$ μm, $P=3$ μm and $\alpha\approx3.8°$. The intensity signal $I+1$ of the positive first-order diffracted light upon vertical incidence of the laser beam is used as the gap detection signal. When a gap is set at the maximum point for M=1, a phase error between the gap detection signal and the reference signal I'−1 is about π/4 within a hatched region for M=0.5 to 1.2, and the intensity of the reference signal I'−1 is larger than zero, thereby discriminating the state of the gap error. A phase difference of about π/4 indicates that the phase of the gap detection signal lags behind that of the reference signal. FIG. 14A is a graph showing a relationship between the gap detection signal I+1 and the reference signal I'−1 with respect to the gap Z. As shown in FIG. 14A, the interference wave A of the gap detection signal lags by about π/4 behind the interference wave B of the reference signal. The maximum point P is detected by using the gap detection signal I+1 (a solid curve) in accordance with the gap measurement method as previously described. Thereafter, the gap detection signal I+1 digitized to derive a signal S1 (FIG. 14B) in the same manner as in the signal S1 shown in FIG. 5B and a binary signal S4 (FIG. 14C) of the reference signal I'−1 represented by a dotted curve are used to detect a gap error state, thereby correcting a deviation in the actual gap from the preset gap. It should be noted that the signal S4 can be generated with reference to the threshold value eM in the same manner as the signal S1.

The gap error state discrimination using the binary signals S1 and S4 is performed in the following manner. When the signal S1 goes low or high, a high or low level of the signal S4 is discriminated, thereby discriminating the state of the gap error. In the case of FIG. 14A, at the overlapping portions of the interference waves, the gap detection signal lags behind the reference signal, that is, the actual gap is smaller than the preset gap. Assume that the gap is preset in the position Z1, and that the actual gap is larger than the preset gap (deviation to the right). When the signal S1 goes low as indicated by reference symbol D1, the signal S4 is kept high. However, assume that the actual gap is smaller than the preset gap (deviation to the left). When the signal S1 goes low as indicated by reference symbol D2, the signal S4 is kept low. Further assume that the preset gap is given at a position Z2. When the actual gap is larger than the preset gap, the signal S4 is set at low level at the rising edge of the signal S1, as indicated by reference symbol U1. However, when the actual gap is smaller than the preset gap, the signal S4 is kept high at the rising edge of the signal S1, as indicated by reference symbol U2. The above operations are summarized in Table 1 below. According to Table 1, the gap error state is discriminated in accordance with the state of the signal S4 when the signal S1 changes.

TABLE 1

| Signal 1 | Signal 4 | Gap Error State |
|---|---|---|
| rising | high | narrow |
|  | low | wide |
| falling | high | wide |
|  | low | narrow |

Table 1 represents the case of the phase error of FIG. 14A. However, when the phase of the gap detection signal leads that of the reference signal, the gap error states are reversed. Since the phase error states of these signals are determined in accordance with combinations of signals to be detected, gap error state information is prestored in the signal processing circuit in accordance with the combinations of signals to be detected.

FIGS. 15 and 16 show test results of the above discrimination by using the positive first-order diffracted light as a gap detection signal and the negative first-order diffracted light as a reference signal derived from the obliquely incidence laser beam. Waves (b) in FIGS. 15 and 16 show binary signals IB for the gap error state description, which are generated from binary signals S4 of the reference signals I'−1 and the binary signals S1 of the gap detection signals I'+1 as mentioned later. FIG. 15 shows the test result when the gap is decreased from a wide gap to a narrow gap, as indicated by sweep direction arrow A, while FIG. 16 shows the test result when the gap is increased from a narrow gap to a wide gap, as indicated by sweep direction arrow B. Within a gap range indicated by reference symbol |←→|, the signals IB are stable, so that the gap error state discrimination can be easily performed. When the signal IB is set low, the gap error state is discriminated as "wide". However, when the signal IB is set high, the gap error state is discriminated as "narrow".

Figure 17:
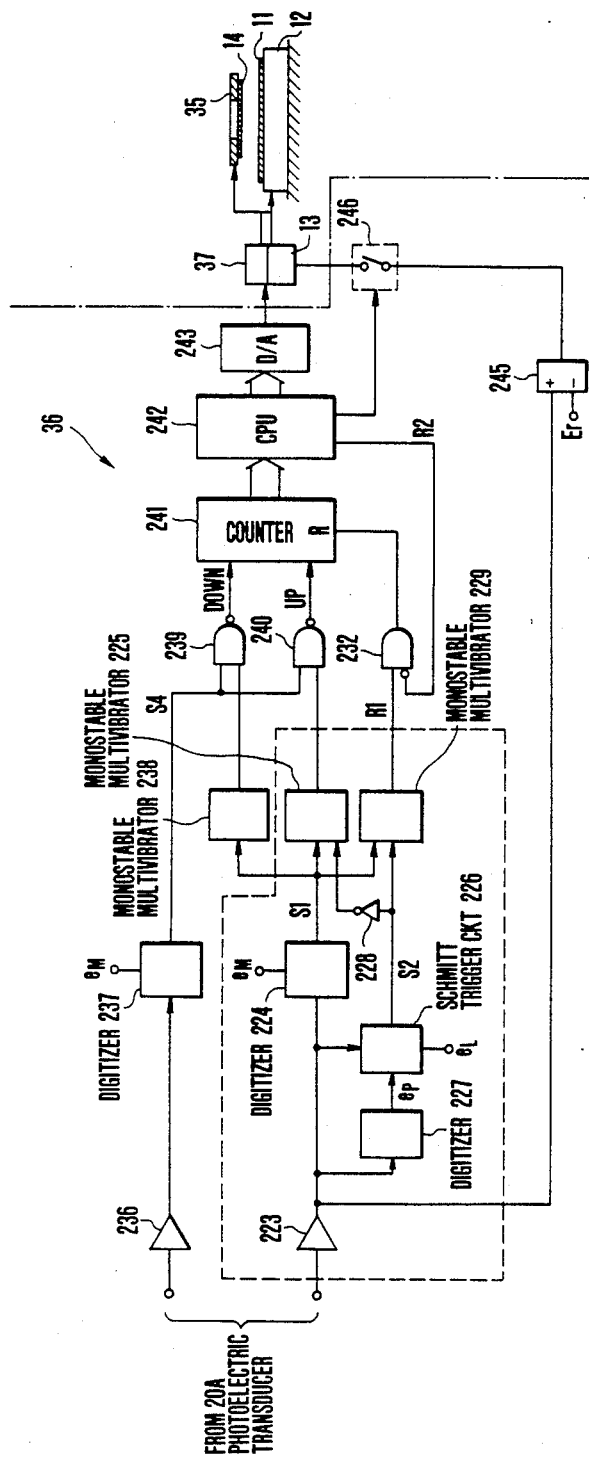
FIG. 17 is a block diagram of a processing/control circuit for generating a gap detection signal in the apparatus of FIG. 11.

FIG. 17 is a signal processing/control circuit for performing a gap error state discrimination function and correcting the gap error in accordance with the gap error state information. A block surrounded by a dotted line in FIG. 17 represents a circuit for detecting the maximum point P of FIG. 14A. This circuit has the same arrangement as part of the signal processing circuit of FIG. 4, and a detailed description thereof will be omitted. The signal S1 from a digitizer 224 is supplied to a monostable multivibrator 238. In this case, a monostable multivibrator 225 generates a pulse when the signal S1 falls. However, the monostable multivibrator 238 generates a pulse when the signal S1 rises. The negative first-order diffraction light intensity signal derived from the obliquely incident laser beam is supplied from the photoelectric transducer 20A to an amplifier 236 and is amplified thereby. The binary signal S4 from a digitizer 237 and the signal S1 are supplied to NAND gates 239 and 240, thereby discriminating a gap error state with respect to the preset gap. The NAND gate 239 receives the output from the monostable multivibrator 238 and the binary signal S4. The NAND gate 240 receives the output from the monostable multivibrator 225 and the binary signal S4. As a result, when the actual gap is wider than the preset gap, the NAND gate 239 generates a down pulse, and the NAND gate 240 generates an up pulse. The down and up pulses are counted by an up/down counter 241, and the current gap can be constantly detected. It should be noted that the maximum point must be detected in accordance with the gap measuring method as previously described before the processing/control apparatus is started, and that the detected gap value must be set in the counter 241. The predetermined count number C of interference waves to be read to detect the maximum point is set by a CPU 242. A reset signal R is also generated from the CPU 242.

The CPU 242 fetches a count from the counter 241 and compares the count with the preset gap value. A difference between the count and the preset gap value is converted by a D/A converter 243 to an analog signal. The analog signal is supplied to the drive units 37 and 13. The drive units 37 and 13 supply feedback signals to the mask stage 35 and the table 12, respectively, so that the gap error between the mask 14 and the wafer 11 is corrected to coincide the detected gap with the preset gap.

Figure 18:
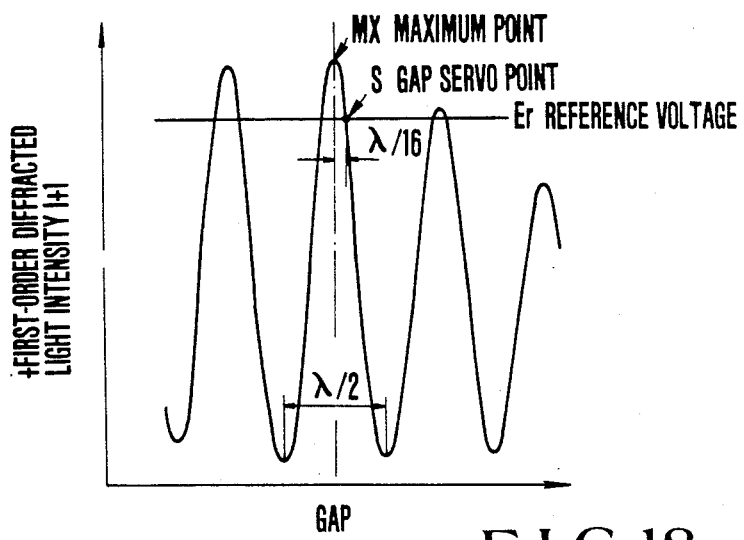
FIG. 18 is a graph for explaining the gap servo state.

As shown in FIG. 18, when a linear portion of the interference wave is used, analog gap servo control can be easily performed with high precision. A difference between a reference voltage Er and the gap detection signal from the amplifier 223 is calculated by a gap servo circuit 245. The difference signal is supplied to the drive units 37 and 13 which drive the mask stage 35 and the table 12, thus setting the gap at a gap servo point S. When the gap servo point S is given within $\lambda/16$ from the maximum point P, high precision gap control with an error of not more than $\pm 0.05$ $\mu$m can be performed.

Gap servo control is performed such that the maximum point P is detected in accordance with the gap measuring/setting method as previously described so as to obtain a preset gap, and that a switch 246 shown in FIG. 17 is turned on in response to a signal from the CPU 242. This gap servo control can also be applied to the arrangement of FIG. 1.

The above gap error correction control is performed when the negative first-order diffracted light intensity signal derived from the obliquely incident laser beam is used as the reference signal. However, other diffracted light components can be used in the following manner.

As shown in FIGS. 12 and 7, the positive first-order diffracted light intensity signal I+1 derived from the vertically incident laser beam and the positive first-order diffracted light intensity signal I'+1 derived from the obliquely incident laser beam, or the negative first-order diffraction light intensity signals I−1 and I'−1 thereof may be used. The gap error state can be discriminated in accordance with a phase difference between the corresponding intensity signals.

Figure 19:
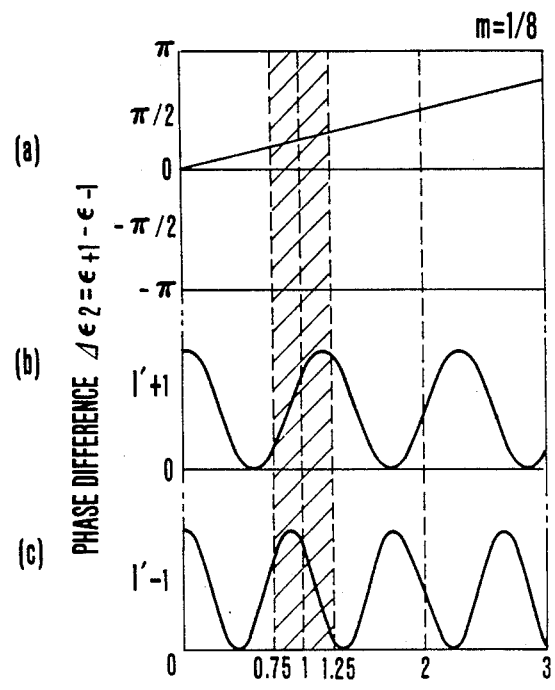
FIG. 19 is a graph showing another phase error state.

FIG. 19 shows another calculation for explaining the gap error discrimination. In this case, a laser beam is obliquely incident on the mask at m=$\frac{1}{4}$. The positive first-order diffracted light intensity signal I'+1 derived therefrom is used as the gap detection signal, and the gap is preset at M=8/7. The gap error state discrimination is performed in accordance with a phase difference $\Delta\epsilon 2=\epsilon+1-\epsilon-1$ between the positive and negative first-order diffracted light intensity signals. A phase difference of about $\pi/4$ exists within the hatched region for M=0.75 to 1.25, so that the gap error state can be accurately discriminated.

Figure 20:
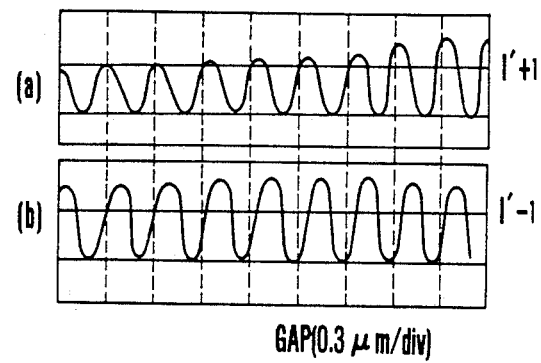
FIG. 20 is a graph showing the experimental results for FIG. 19.

FIG. 20 shows test results obtained when positive and negative first-order diffracted light intensity signals I'+1 and I'−1 near a gap of 14 $\mu$m (M=1) are detected when a diffraction grating pitch is 3 $\mu$m, a laser wavelength is 0.6328 $\mu$m, and an incident angle $\theta \approx 0.76°$ (m=$\frac{1}{4}$). As is apparent from the graph, a phase difference between the interference waves is present.

Figures 21, 22:
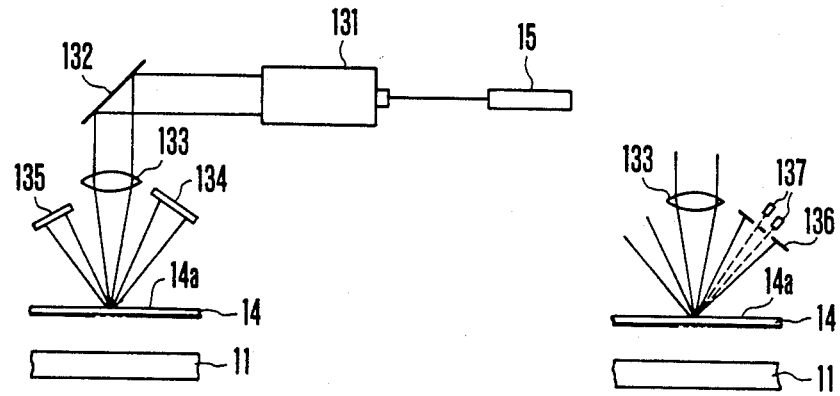
FIGS. 21 and 22 are diagrams showing modifications of the apparatus of FIG. 1, respectively.

FIG. 21 shows still another embodiment of the present invention. Referring to FIG. 21, a laser beam emitted from a laser source 15 is expanded by an expander lens 131. The expanded beam is deflected by a mirror 132. The deflected beam is then focused by a lens 133 having a focal point on the mask surface, thereby forming a beam spot on a diffraction grating mark 14a. The positive and negative first-order diffracted light components from the diffraction grating mark 14a appear within a spot having the same angle as the beam focusing angle. However, the intensities of these light components change in accordance with the angle component m of the equation as previously described, thus resulting in interference fringes.

The interference fringes are detected by CCD image sensors 134 and 135 which measure diffracted light intensity at any angle. When intensities of diffracted light within the positive first-order diffracted light spot which correspond to m=0 and m=$\frac{1}{4}$ for vertically and obliquely incident light beams are measured respectively, the same signals as in FIG. 12 are obtained, so that the gap can be preset and the gap error state can be discriminated. A spatial filter and a photodetector may be used in place of the CCD image sensors to separate and extract desired signals. For example, as shown in FIG. 22, instead of the CCD image sensor 134 of FIG. 21, a spatial filter 136 having an aperture corresponding to a light component having a predetermined divergent angle, and photodetectors 137 are arranged to extract diffracted light components derived from only the vertical and oblique incidence operations.

When the reference signal is used in addition to the gap detection signal, the gap error state is discriminated, and the gap error is then corrected. At the same time, by utilizing the interference wave, gap servo control is performed to control the gap with high precision.

Figure 23:
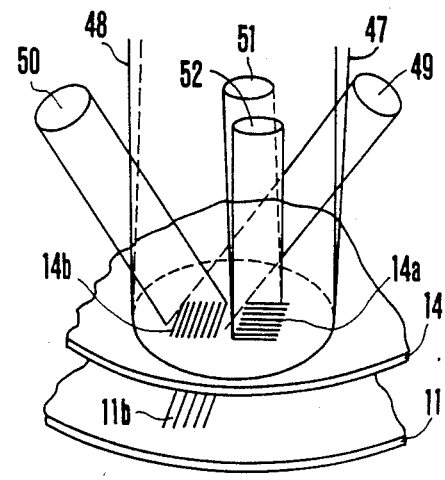
FIG. 23 is a diagram showing the basic arrangement of the dual diffraction gratings for detecting the gap and the positional error by using the diffraction grating.

An alignment control apparatus for performing alignment in combination with the gap control apparatus described above will be described hereinafter. In the alignment control apparatus, a positional error detection mark 14b is formed in the vicinity of a gap detecting mark 14a of a mask 14, as shown in FIG. 23. A diffraction grating 11b is arranged on a wafer 11 located immediately under the mask 14. A positional error detecting dual diffraction grating consisting of the diffraction gratings 14b and 11b is utilized. The wafer diffraction grating 11b comprises a reflection diffraction grating 162 and is prepared such that the wafer 11 is etched in a step manner. Its pitch is twice that of the mask diffraction grating 14b so as to prevent interference with the light component reflected by the lower surface of the mask diffraction grating 14b, as shown in FIG. 24. An alignment method using a dual diffraction grating with a double pitch is disclosed in Japanese Patent Disclosure No. 56-61608 and can be utilized here. The gap detecting diffraction grating and the positional error detecting diffraction grating are disposed within a single spot derived from vertically incident laser beam in such a manner that the gratings thereof are perpendicular to each other so as to prevent interference between their diffracted light components. The intensities I"+1 and I"−1 of the positive and negative first-order diffracted light components 49 and 50 resulting from the vertical incidence of a laser beam 47 on the positional error detecting diffraction grating 14b are used as positional error detection signals, an intensity I−1 of a negative first-order diffracted light component 52 derived from the vertical incidence of a laser beam 47 on the gap detecting diffraction grating 14a is used as a gap detection signal, and an intensity I'−1 of a negative first-order diffracted light component 51 derived from the oblique incidence of a laser beam 48 on the gap detecting diffraction grating 14a is used as the reference signal. The light components (e.g., 50 and 51) which are diffracted perpendicular to each other have a strong intensity with respect to the incident beam; the diffracted light component (e.g., 50) from the positional error detecting diffraction grating 14b has a strong intensity at $\theta P = \sin^{-1}(2m\lambda/PW)$ ($m=0\pm 1, \pm 2, \ldots$) where $\lambda$ is the wavelength of the laser beam, PW is the pitch of the positional error detecting wafer diffraction grating mark 11b; and the diffracted light component (e.g., 51) from the gap detecting diffraction grating has a strong intensity at $\theta G = \sin^{-1}(2m\lambda/PG)$ where PG is the pitch of the gap detecting diffraction grating mark 14a.

FIGS. 25A and 25B show the positive and negative first-order diffracted light component intensities I″+1 and I″−1 and a difference ΔI″=I″+1−I″−1 therebetween. The intensity difference ΔI″ in FIG. 25B is used as the positional error detection signal. The positional error detection signal has the same period as the pitch of the diffraction grating 14b formed on the mark 14 and causes zero-crossing at a point corresponding to a positional error d=0 or d=PM/2. By detecting this point, alignment of the mask with the wafer can be performed.

FIG. 26 is a test result showing a difference signal ΔI″ between the positive and negative first-order diffracted light components when a mask diffraction grating pitch PM is 3 μm, a wafer diffraction grating pitch PW is 6 μm, a laser wavelength λ is 0.6328 μm, and a gap is 20.3 μm. By detecting zero point of this signal, alignment of the mark with the wafer can be performed a maximum value of a sum signal $\Sigma I'' = I'' + 1 + I'' - 1$ of the intensity signals I″+1 and I″−1 of the diffracted light components 49 and 50 may be detected to perform alignment of the mask with the wafer.

In order to perform positional error control and gap control, when the positional error and gap detecting diffraction gratings having pitches which satisfy condition $PW^2(K+\frac{1}{2})=PG^2 \cdot k$ are used, a high precision positional error detection signal is obtained while gap servo control is being performed near the maximum value of the envelope wave.

Figure 27:
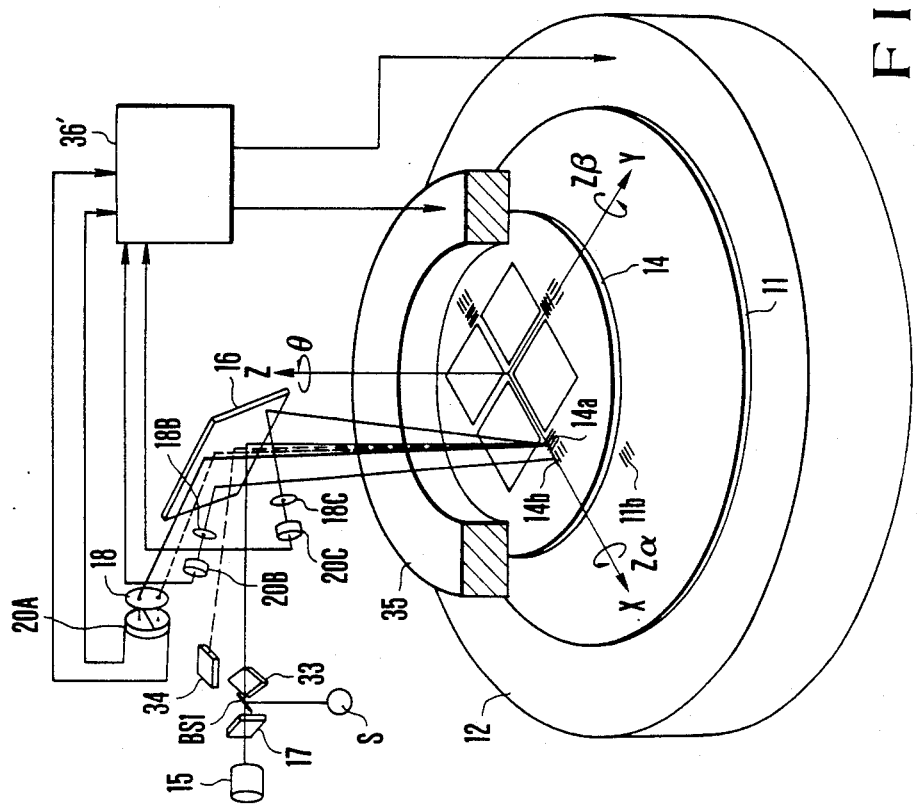
FIG. 27 is a diagram showing the basic arrangement of an alignment control apparatus according to still another object of the present invention.

FIG. 27 shows an embodiment of the alignment control apparatus. In addition to the components of the gap control apparatus, this alignment control apparatus comprises spatial filters 18B and 18C for filtering out only the positive and negative first-order diffracted light components and photoelectric transducers 20B and 23C for receiving the positive and negative first-order diffracted light components generated from the positional error detecting diffraction gratings 11b and 14b. In addition to the gap detection signal processing/control circuit, a signal processing/control circuit 36′ comprises a positional error signal processing/control circuit. A four-axis, i.e., Z, θ (rotational angle about the Z-axis), Zα (rolling angle about the X-axis), and Zβ (rolling angle about the Y-axis) fine adjustment mechanism is arranged on a mask stage 35. An X-Y fine adjustment mechanism is arranged on a wafer stage 12. The gap/positional error detecting system shown in FIG. 27 comprises at least three units which allow gap and positional error measurements at three points of the mask. After the gap is set and the gap servo control mode is acted in accordance with the gap measuring/control method as previously described, alignment of the mask with the wafer is performed. Three units are also utilized in order to set a mask and wafer to be parallel with each other. In this case, three-point gap control is performed such that the signal processing/control circuit 36′ calculates differences ΔZ1, ΔZ2 and ΔZ3 between the measured gaps and the preset gap, and the components Z, Zα, and Zβ are calculated (see J. Jpn. Soc. Prec. Engng. Vol. 43, No. 8 (1980), p. 1003. The calculated values are fed back to the mask stage 35, thereby aligning the mask with the wafer.

Figure 28:
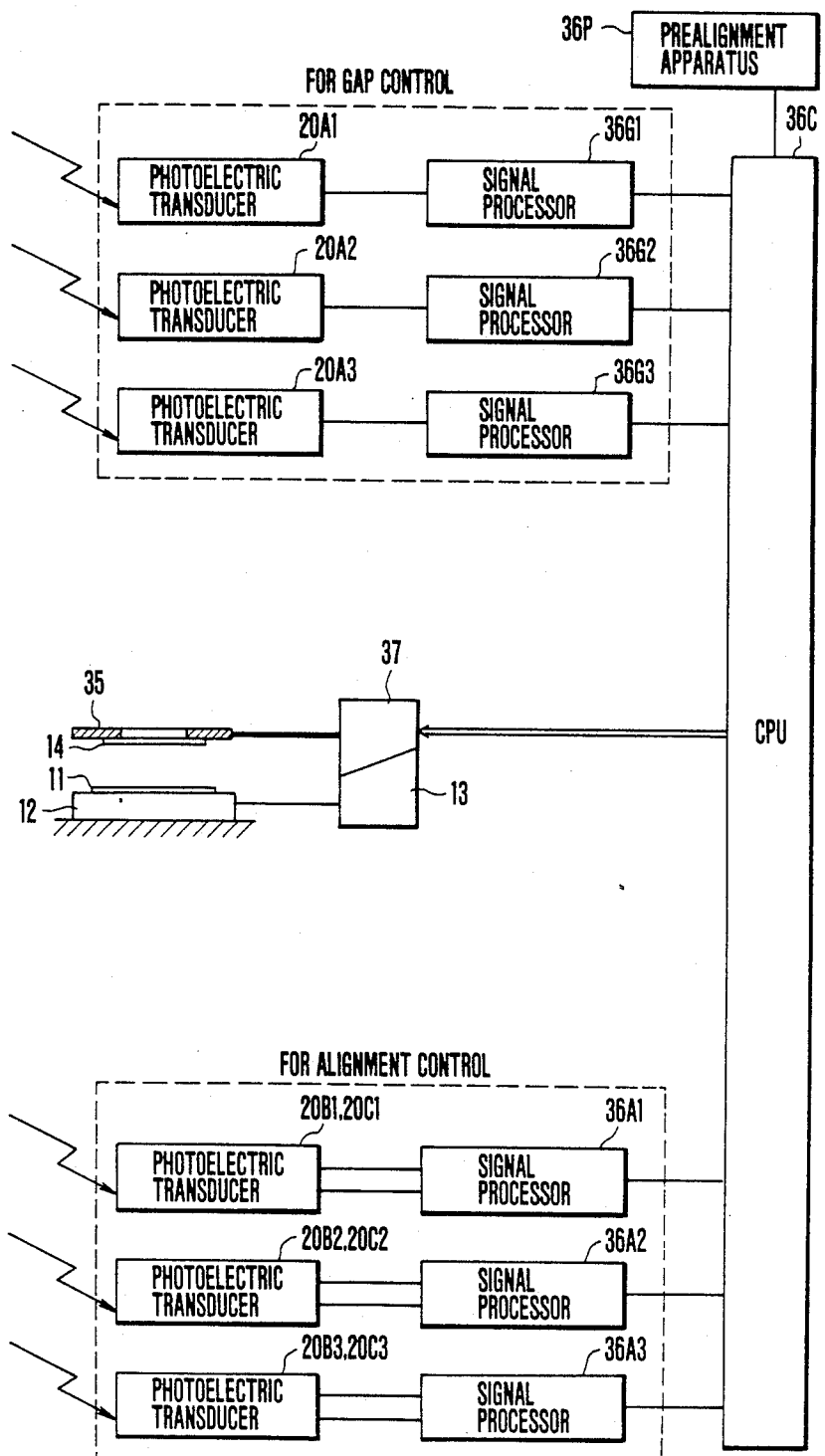
FIG. 28 is a diagram showing the system configuration of the apparatus of FIG. 27.
Figure 31:
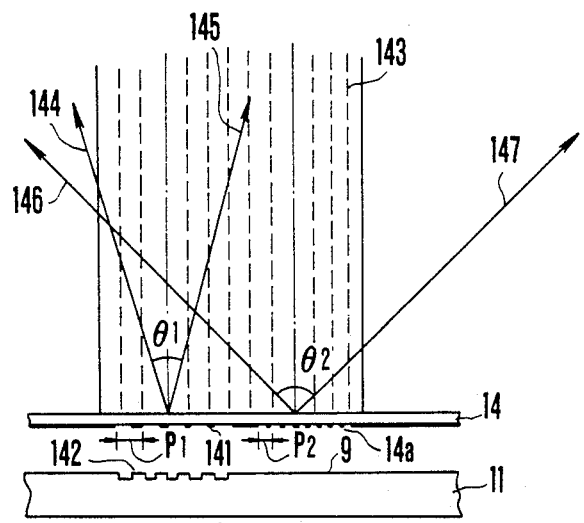
FIG. 31 is a diagram showing the another arrangement of the dual diffraction gratings.

FIG. 28 shows the overall system configuration of the control apparatus of FIG. 27. In this arrangement, a mask 14 subjected to the three-point alignment method has a gap detecting mark 14a and an alignment detection mark 14b which are formed adjacent to each other at each of three positions. A gap detecting mark (a reflecting surface) and an alignment detection mark 11b are formed at each one of the corresponding positions on a wafer 11. The photoelectric transducers 20A1, 20A2 and 20A3 are arranged to receive diffracted light components from three positions. The positive and negative diffracted light components from the alignment detection marks 14b adjacent to the gap detecting marks 14a are respectively detected by the photoelectric transducers 20B1 and 20C1, the photoelectric transducers 20B2 and 20C2, and the photoelectric transducers 20B3 and 20C3. Outputs from the respective photoelectric transducers are supplied to the signal processing circuits 36G1 to 36G3 and the signal processing circuits 36A1 to 36A3. The results are supplied to the drive units 37 and 13 for the mask stage 35 and the wafer stage 12 through a CPU 36C, thereby controlling the positions of the corresponding stages. The above-mentioned control apparatus is used to control a small or narrow gap and perform positional control. Prealignment of the mask is performed in response to an output from a detecting apparatus connected to and controlled by the CPU 36C.

Referring to FIG. 27, a beam splitter BS1 is arranged between the λ/4 plate 17 located along the optical path and the beam splitter 33. The beam splitter BS1 guides the returning beam reflected by the mirror 16 to a sensor S. A sensor S for receiving the zero-order diffracted light from the mark is used to detect whether or not the laser beam is incident vertically on the marks of the mask 14 and the wafer 11 immediately after the system is initialized.

FIG. 29 shows a positional error detection signal processing/control circuit. The signals from the photoelectric transducers 20B and 20C are amplified by amplifiers 57 and 56, respectively. A difference ΔX1 between these amplified signals is calculated by a subtracter 58. The difference signal ΔX1 is supplied to the CPU 36C serving as a control circuit for the θ-axis of the mask stage and X- and Y-axes of the wafer stage. Similarly, the difference signals ΔX2 and ΔY from other two mask points are also supplied to the CPU 36C. By using these difference signals ΔX1 and ΔX2, Δθ and ΔX are calculated by the control circuit 36C in accordance with the following equations. The components Δθ, ΔX and ΔY are supplied to the drive circuits 37 and 13.

$$\Delta\theta = (\Delta X1 - \Delta X2)/l \quad (6)$$

$$\Delta X = (\Delta X1 + \Delta X2)/2 \quad (7)$$

where l is the distance between the rotation center and the alignment mark. The drive circuits 37 and 13 apply drive voltages corresponding to the components Δθ, ΔX and ΔY to the mask stage 35 and the wafer stage 12, thereby completing alignment control.

The present invention is not limited to the particular embodiments described above. Various changes and modifications may be made within the scope and spirit of the invention. In the above embodiments, each light source comprises a laser source. However, the same effect may be obtained by using a quasi-monochromatic light source. In the embodiment described with reference to FIGS. 25A and 25B, after the gap setting operation is completed, alignment is started. However, when the gap is set in the vicinity of the maximum point, alignment can be started simultaneously.

In the embodiment shown in FIGS. 23 and 27, the diffraction gratings are arranged within a single spot, and a single beam irradiates the the diffraction gratings. However, separate beams may irradiate the positional error detecting diffraction grating and the gap detecting diffraction grating to obtain the same effect as in FIGS. 23 and 27.

The two-split detector is used to receive the gap detecting diffraction light in FIGS. 11 and 27. However, when the two diffracted light components are spatially split, individual photoelectric transducers may be utilized.

The absorbed type diffraction grating is used as the mask diffraction grating in the embodiment of FIGS. 11, 23 and 27. However, a phase difference type transmission diffraction grating may be used in the same manner as in the wafer diffraction grating.

In the above embodiment, the diffraction gratings are arranged perpendicularly to each other to prevent interference between the positional error detecting diffracted light component and the gap detecting diffracted light component. In this case, when the alignment mark is arranged in the vicinity of the exposure region, one of the positional error and gap detecting diffraction light components may be diffracted into the exposure region. In order to detect this diffracted component, detectors 151 must be arranged at two sides outside the exposure region 152, as shown in FIG. 30. When a diffraction angle is small, one of the detectors 151 must be far above the mask. As a result, the detection optical system is large, and an increase in the distance between the X-ray source and the mask results in a decrease in the throughput.

An effective way of avoiding the drawbacks described above is to vary a pitch P1 of a positional error detecting mask diffraction grating 141 from a pitch P2 of a gap detecting diffraction grating 14a. In this case, the pitch P1 is larger than the pitch P2. Because pitches P1 and P2 are different, diffraction angles $\theta 1$ and $\theta 2$ differ from each other. The detection signals derived from the diffraction gratings having the pitches P1 and P2 can be completely separated. The two diffracted light components are diffracted along the exposure region. Therefore, the photoelectric transducers can be arranged in the vicinity of the exposure region. A distance between the X-ray source and the mask can be shortened to improve the throughput. However, when the pitches P1 and P2 differ by an integer multiple, the diffraction angles of the first-order diffracted light component and a high-order diffracted light component coincide with each other. Therefore, the pitches P1 and P2 must not differ from each other by an integer multiple.

The transverse alignment can be also performed by using the diffracted light generated when the laser beam is incident obliquely on the position error detecting diffraction grating mark. In this case, the gap control and the transverse alignment control can be performed by using the only obliquely incident beam.

Figure 32:
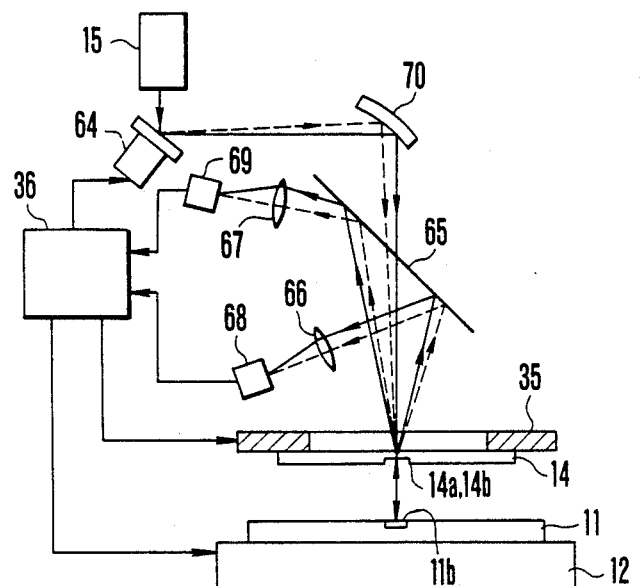
FIG. 32 is a diagram showing a gap control apparatus according to still another embodiment of the present invention.

FIG. 32 shows still another embodiment of the present invention which is adapted for a gap/alignment control apparatus for controlling the gap and performing alignment between two objects. Referring to FIG. 32, reference numeral 64 denotes an incident angle deflecting mirror; 14a and 14b, transmission diffraction grating marks; 11b, a reflection diffraction mark; 65, a half mirror; 66 and 67, focusing lenses, respectively; 68 and 69, photosensors; and 70, a spherical mirror, respectively.

With this arrangement, a coherent light beam emitted from a laser source 15 is deflected by the incident angle deflecting mirror 64 comprising a Galvanometer, a deflecting element or the like. The deflected beam is reflected by a spherical mirror 70 and is incident on the diffraction grating marks 14a and 14b (i.e., a single point) of the mask 14 held by a vacuum chuck mask table 35. The beam incident on the diffraction grating marks 14a and 14b on the mask 14 is reflected by a reflecting mark 11b formed on the wafer 11 (or a surface of the wafer) held on the wafer stage 12. The reflected beam passes again through the diffraction grating marks 14a and 14b.

The marks 14a and 14b formed on the mask 14 comprises a transmission diffraction grating. This mark is a diffraction grating pattern and is formed with a thin opaque film on a transparent substrate constituting the mask 14 or on a thin transparent film. The mark on the wafer 11 is prepared such that a nonreflecting film is partially removed to expose a reflecting surface of the wafer 11. A beam represented by the solid lines is incident on the diffraction grating at a right angle, and a beam represented by the dotted line is deflected by the incident angle deflecting mirror 64 and is obliquely incident on the diffraction grating.

As is apparent from the above description, when the gap control method using the gap detecting diffraction grating is used together with the alignment control method using the positional error detecting dual diffraction grating, the gap setting operation is independently performed in the manner as previously described. Thereafter, alignment is performed in accordance with the dual diffracted light intensity scheme. The signals of these two diffracted light components can be completely separated to simplify subsequent signal processing. In this case, an extra gap setting diffraction grating is required as compared with the conventional dual diffraction grating method. However, such a diffraction grating is arranged for only the mask, and does not impose much of a load.

When the two diffraction gratings marks within a single beam spot are arranged perpendicularly to each other or their pitches are changed, the diffracted light intensity signals therefrom will not interfere with each other. Therefore, gap detection can be performed simultaneously with positional error detection and with high precision.

In a conventional step-and-repeat type X-ray exposure apparatus, gap detection cannot be performed while the next exposure region is being set during stepping. A gap between the mask and the wafer is increased so as to prevent their contact after each exposure cycle is completed. The gap must be set again, and alignment of the mask with the wafer along the Z-axis must be performed again, thus starting the next exposure operation. For this reason, a long alignment time is required. When the number of exposures is increased along with an increase in a diameter of wafers, the throughput is greatly degraded.

However, according to the gap control method of the present invention, the alignment mark of the wafer can comprise simply a reflecting surface. An inscribed line on the wafer serves as the reflecting surface. In this case, stepping is performed while the gap detecting mask diffraction grating mark traces the inscribed line, the exposure area can be changed from the first exposure area to the second exposure area while gap control is being performed after the gap is preset, and the mask is aligned with the wafer along the Z-axis in the first exposure region. Therefore, time is not wasted on resetting the gap, and the mask can be aligned with the wafer at high speed.

What is claimed is:

1. A method of adjusting a relative positional relationship between two objects using a diffraction grating, wherein a first diffraction grating is arranged on a first object located to oppose a second object, a reflecting surface is arranged at a position on said second object such that said reflecting surface is aligned in reflecting relationship with said first diffraction grating, and wherein said method includes the steps of irradiating said first diffraction grating with a radiation beam of coherent light or quasimonochromatic light, measuring a gap between the first and second objects and setting said gap in accordance with a change in intensity of diffracted light components from said first diffraction grating.

2. A method according to claim 1, wherein said radiation beam comprises a laser beam.

3. A method according to claim 1, wherein said first diffraction grating comprises a transmission diffraction grating; the radiation beam is incident on said first diffraction grating at a right angle; and the diffracted light components comprise a diffracted light component reflected by said first diffraction grating, a diffracted light component transmitted and diffracted by said first diffraction grating, reflected by said reflecting surface and passing through said first diffraction grating, and a diffracted light component passing through said first diffraction grating, reflected by said reflecting surface and transmitted and diffracted by said first diffraction grating.

4. A method according to claim 3, wherein the changes in intensities occur in a positive first-order diffracted light component and/or a negative first-order diffracted light component among all diffracted light components, any one of the changes in intensities of the positive first-order diffracted light component, the negative first-order diffracted light component, and a sum of the positive and negative first-order diffracted light components is used as a gap detection signal, and a maximum or minimum point or a point in a vicinity thereof of the gap detection signal is detected and discriminated for gap measurement/setting.

5. A method according to claim 4, wherein the discrimination is performed by detecting a maximum value of interference waves of an envelope wave constituting the gap detection signal.

6. A method according to claim 4, wherein the discrimination is performed by detecting a maximum value of interference waves of an envelope wave constituting the gap detection signal and by counting the number of peaks of subsequent interference waves.

7. A method according to claim 1, wherein said first diffraction grating comprises a transmission diffraction grating; and the radiation beam is obliquely incident on said first diffraction grating to derive a negative first-order diffracted light component and a positive first-order diffracted light component, any one of the changes in intensity of the negative or positive first-order diffracted light component, or a sum of or a difference between the negative and positive first-order diffracted light components is utilized.

8. A method according to claim 1, wherein the radiation beam comprises vertically and obliquely incident light components which are respectively incident on said first diffraction grating, the change in intensity of the diffracted light component derived from the vertically incident light component serves as a gap detection signal, the change in intensity of the diffracted light component derived from the obliquely incident light component serves as a reference signal, and said method comprises the step of measuring the gap from the gap detection signal and setting the gap to a predetermined value, and the step of discriminating a gap error state when a current gap is deviated from the predetermined value in accordance with a phase difference between the gap detection signal and the reference signal and correcting the current gap to the predetermined value in accordance with the gap error state.

9. A method according to claim 8, wherein the gap error state is discriminated in accordance with any one of combinations of the positive and negative first-order diffracted light components derived from the vertically and obliquely incident light components.

10. A method according to claim 9, wherein the radiation beam is focused and is incident on the first diffraction grating.

11. A method of adjusting a relative positional relationship between two objects using a diffraction grating, wherein a first diffraction grating comprises a transmission diffraction grating and is arranged on a first object located to oppose a second object, a reflecting surface is arranged at a position on said second object such that said reflecting surface is substantially aligned in reflecting relationship with said first diffraction grating, and wherein
  said method includes the step of irradiating said first diffraction grating vertically and obliquely with vertical and oblique radiation beams of coherent light or quasi-monochromatic light,
  the step of producing a gap detection signal from the change in intensity of diffracted light components derived from said vertical radiation beam irradiating said first diffraction grating, so that said diffracted light components comprise a diffracted light component reflected by said first diffraction grating, a diffracted light component transmitted and diffracted by said first diffraction grating, reflected by said reflecting surface and passing through said first diffraction grating, and a diffracted light component passing through said first diffraction grating, reflected by said reflecting surface and transmitted and diffracted by said first diffraction grating,
  the step of producing a reference signal from the change in intensity of a diffracted light component derived from said oblique radiation beam,
  the step of measuring the gap as indicated by said gap detection signal and setting said gap to a predetermined value by detecting a maximum or minimum point, or a point in a vicinity thereof, of the gap detection signal, when said gap detection signal is produced from the change in intensity which occurs in a positive first-order diffracted light component and/or a negative first-order diffracted light component among all diffracted light components, which are derived from the vertical radiation beam, and
  the step of discriminating a gap error state when a current gap is deviated from a predetermined value which indicates a desired gap in accordance with a phase difference between the gap detection signal and the reference signal and correcting the current gap to said predetermined value in accordance with the gap error state.

12. A method according to claim 1, wherein a second diffraction grating is arranged on said first object in a vicinity of said first diffraction grating, a third diffraction grating is arranged in a portion of said second object and substantially aligned in reflecting relationship with said second diffraction grating, said second diffraction grating being irradiated with another radiation beam of coherent light or quasi-monochromatic light, said method further including the step of controlling a transverse alignment error between said first and second objects in accordance with the change in intensity of a diffracted light component reflected and diffracted by said second and third diffraction gratings.

13. A method according to claim 12, wherein the radiation beam and said another radiation beam which are incident on said first and second diffraction gratings are emitted from a single light source.

14. A method according to claim 12, wherein the radiation beam is incident on said first and second diffraction gratings at a substantially right angle, and said another radiation beam is obliquely incident on at least said first diffraction grating.

15. A method according to claim 14, wherein said first and second diffraction gratings are arranged perpendicularly to each other when said first and second diffraction gratings are viewed in a two-dimensional manner.

16. A method according to claim 14, wherein said first and second diffraction gratings have different pitches one of which is not an integer multiple of the other.

17. A method according to claim 14, wherein the gap between said first and second diffraction gratings is set to about $kPG^2/\lambda$ (where k is an integer, $\lambda$ is a wavelength of the vertically incident light component, and PG is the pitch of said first diffraction grating), and said third diffraction grating has a pitch which is an integer multiple of a pitch of said second diffraction grating.

18. A method according to claim 17, wherein the pitches of said first and second diffraction gratings satisfy a relation:

$$PW^2(k+\tfrac{1}{2})=PG^2k$$

where PW is the pitch of said second diffraction grating.

19. A method according to claim 14, wherein said method further includes the step of performing gap servo control by using one of the interference waves in the gap detection signal and by using a value lower than a peak value of said one of the interference waves, as a servo point.

20. A method of adjusting a relative positional relationship between two objects using a diffraction grating, wherein a first diffraction grating comprises a transmission diffraction grating and is arranged on a first object located to oppose a second object, a reflecting surface is arranged at a position on said second object such that said reflecting surface is substantially aligned in reflecting relationship with said first diffraction grating, and said method includes the step of irradiating said first diffraction grating vertically and obliquely with a radiation beam of coherent light or quasi-monochromatic light, the steps of producing a gap detection signal from the change in intensity of the diffracted light components derived from the vertical radiation beam, when the diffracted light components, which are derived from vertical radiation beam, from said first diffraction grating, comprise the diffracted light components being constituted by a diffracted light component reflected by said first diffraction grating, a diffracted light component transmitted and diffracted by said first diffraction grating, reflected by said reflecting surface and passing through said first diffraction grating, and a diffracted light component passing through said first diffraction grating, relected by said reflecting surface and transmitted and diffracted by said first diffraction grating, and of producing a reference signal from the change in intensity of a diffracted light component derived from oblique radiation beam, the step of measuring the gap from said gap detection signal and setting the gap to a predetermined value by detecting a maximum or minmum point or a point in a vicinity thereof of the gap detection signal when said gap detection signal is produced from the change in intensity which occurs in a positive first-order diffracted light component and/or a negative first-order diffracted light component among all diffracted light components, which are derived from the vertical radiation beam, and the step of discriminating a gap error state when a current gap is deviated from the predetermined value in accordance with a phase difference between the gap detection signal and the reference signal and correcting the current gap to the predetermined value in accordance with the gap error state, wherein a second diffraction grating is arranged on said first object in a vicinity of said first diffraction grating, a third diffraction grating is arranged in a portion of said second object and substantially aligned in reflecting relationship with said second diffraction grating, said second diffraction grating being irradiated with said vertical radiation beam, said first and second diffraction gratings having pitches which satisfy a relation:

$$PW^2(k=\tfrac{1}{2})=PG^2k$$

where PG and PW are the pitch of said first and second diffraction gratings, respectively, said method further including the step of controlling a transverse alignment error between said first and second objects in accordance with the change in intensity of the diffracted light component reflected and diffracted by said second and third diffraction gratings, and said method further includes the step of performing gap servo control by using one of the interference waves in the gap detection signal and by using a value lower than a peak value of said one of the interference waves as a servo point.

21. An apparatus for adjusting a relative positional relationship between two objects using a diffraction grating, comprising: at least a first diffraction grating formed on a portion of a first object such that said first diffraction grating is aligned in reflecting relationship with a reflecting surface of a second object; first radiating means for radiating a first radiation beam of coherent light or quasi-monochromatic light to said first diffraction grating; a first converting means for receiving a first diffracted light component from said first diffraction grating caused by the radiation of said first diffraction grating with said first radiation beam and converting the first diffracted light component to a gap detection signal; and processing means for processing said gap detection signal to calculate a gap beween said first and second objects.

22. An apparatus according to claim 21, further comprising: second irradiating means for obliquely irradiating a second radiation beam of coherent light or quasi-monochromatic light onto at least said first diffraction grating; second converting means for receiving a second diffracted light component from said second irradiating means and converting the second diffracted light component to a reference signal; phase error detecting means for detecting a phase error between the gap detection signal and the reference signal; gap control signal generating or processing means for setting the gap to a predetermined value in accordance with the gap detection signal and correcting a gap error in accordance with information from said phase error detecting means, thereby generating a gap control signal; and mechanism means for changing the gap between said first and second objects in accordance with the gap control signal.

23. An apparatus according to claim 22, further comprising gap servo signal processing means for generating a gap servo signal in accordance with the gap detection signal, the gap servo signal being supplied to said mechanism means.

24. An apparatus according to claim 22, wherein said first irradiating means is arranged to irradiate said first radiation beam to second diffraction grating at a substantially right angle, said second diffraction grating being arranged in a vicinity of said first diffraction grating; and further comprising third converting means for receiving a third diffracted light component which is derived from said first radiation beam and a dual diffraction grating consisting of said second diffraction grating and a third diffraction grating located on a portion of the second object, said portion being disposed in opposing relationship to said second diffraction grating, and alignment control signal processing means for processing the positional error detection signal and generating an alignment control signal, the alignment control signal being supplied to said mechanism means.

25. An apparatus according to claim 24, further comprising: two more sets of said first and second irradiating means; two more sets of said first to third converting means, said phase error detecting means, said gap control signal processing means, said gap servo signal processing means and said alignment control signal processing means so as to correspond to said two more sets of said first and second irradiating means; and processing means for receiving signals from three sets of said gap control signal processing means, said gap servo signal processing means and said alignment control signal processing means and for generating control signals to set said first and second objects to be parallel to each other, the gap between said first and second objects to a predetermined value, and the transverse positional error between said first and second objects to zero, the control signals from said processing means being supplied to said mechanism means.

* * * * *

UNITED STATES PATENT AND TRADEMARK OFFICE
CERTIFICATE OF CORRECTION

PATENT NO. : 4,656,347
DATED : 4/7/87
INVENTOR(S) : Une et al.

It is certified that error appears in the above-identified patent and that said Letters Patent is hereby corrected as shown below:

On the title page

Column [30] under "Foreign Application Priority Data"

delete "Japan......06-8694"

insert --Japan......60-8694--

| COLUMN | LINE | DESCRIPTION |
|--------|------|-------------|
| 07 | 57 | delete "+" insert --$\underline{+}$-- |
| 08 | 08 | delete "a" after "curve" insert --$\underline{a}$-- |
| 08 | 09 | delete "b" insert --$\underline{b}$-- |

Signed and Sealed this

Twenty-fifth Day of October, 1988

*Attest:*

DONALD J. QUIGG

*Attesting Officer*  Commissioner of Patents and Trademarks